US009875784B1

(12) United States Patent
Li et al.

(10) Patent No.: US 9,875,784 B1
(45) Date of Patent: Jan. 23, 2018

(54) THREE-DIMENSIONAL (3D) FERROELECTRIC DIPOLE METAL-OXIDE SEMICONDUCTOR FERROELECTRIC FIELD-EFFECT TRANSISTOR (MOSFEFET) SYSTEM, AND RELATED METHODS AND SYSTEMS

(71) Applicant: QUALCOMM Incorporated, San Diego, CA (US)

(72) Inventors: Xia Li, San Diego, CA (US); Seung Hyuk Kang, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/486,891

(22) Filed: Apr. 13, 2017

(51) Int. Cl.
*G11C 11/22* (2006.01)
*H01L 27/1159* (2017.01)
*H01L 27/11592* (2017.01)
*H01L 27/11597* (2017.01)

(52) U.S. Cl.
CPC ........ *G11C 11/223* (2013.01); *G11C 11/2275* (2013.01); *H01L 27/1159* (2013.01); *H01L 27/11592* (2013.01); *H01L 27/11597* (2013.01)

(58) Field of Classification Search
CPC .............. G11C 11/223; G11C 11/2275; H01L 27/11597; H01L 27/1159; H01L 27/11592
USPC ........................................................ 365/145
See application file for complete search history.

(56) References Cited

U.S. PATENT DOCUMENTS

| | | | | |
|---|---|---|---|---|
| 6,737,694 B2 * | 5/2004 | Kim | ................... | H01L 27/11502 257/295 |
| 7,030,435 B2 * | 4/2006 | Gnadinger | .............. | G11C 11/22 257/295 |
| 7,052,941 B2 * | 5/2006 | Lee | ........................ | B82Y 10/00 257/E27.026 |
| 7,768,811 B2 | 8/2010 | Matsuno et al. | | |
| 8,227,701 B2 * | 7/2012 | Wrazien | ................. | B82Y 10/00 174/250 |
| 8,477,522 B2 | 7/2013 | Clinton et al. | | |
| 8,824,214 B2 | 9/2014 | Shur et al. | | |
| 9,030,881 B2 | 5/2015 | Tokuhira et al. | | |
| 9,413,349 B1 | 8/2016 | Li et al. | | |
| 9,508,439 B2 | 11/2016 | Li et al. | | |
| 2014/0043899 A1 | 2/2014 | Chang et al. | | |

* cited by examiner

*Primary Examiner* — Tha-O H Bui
(74) *Attorney, Agent, or Firm* — Withrow & Terranova, PLLC

(57) ABSTRACT

A three-dimensional (3D) ferroelectric dipole metal-oxide semiconductor ferroelectric field-effect transistor (MOSFeFET) system, and related methods and systems are disclosed. The 3D ferroelectric dipole MOSFeFET system includes a bottom dielectric layer, a gate layer disposed above the bottom dielectric layer, and a top dielectric layer disposed on top of the gate layer. The 3D ferroelectric dipole MOSFeFET system also includes at least one source line (SL) line and at least one bit line (BL). At least one interconnect, which extends between the bottom dielectric layer and the top dielectric layer interconnects the at least one SL with the at least one BL. A ferroelectric dipole MOSFeFET(s) is formed at an intersection area of the at least one interconnect and the gate layer. The 3D ferroelectric dipole MOSFeFET system can lead to improved component density and reduced footprint.

30 Claims, 16 Drawing Sheets

THREE-DIMENSIONAL (3D) FERROELECTRIC DIPOLE METAL-OXIDE SEMICONDUCTOR FERROELECTRIC FIELD-EFFECT TRANSISTOR (MOSFEFET) SYSTEM, AND RELATED METHODS AND SYSTEMS

BACKGROUND

I. Field of the Disclosure

The technology of the disclosure relates generally to metal-oxide semiconductor (MOS) field-effect transistors (MOSFETs), and particularly to MOSFETs used as programmable dipole switching devices, such as in memory cells.

II. Background

In modern computing systems, processors such as central processing units (CPUs) and digital signal processors (DSPs) process binary input signals based on a set of machine executable binary instructions and generate binary output signals as a result. To produce the expected results, processors must be able to accurately determine the state of an input signal (e.g., whether the input signal represents a binary zero or a binary one). The determinations are usually based on detecting a voltage level of the input signal and are carried out by logic gates. These logic gates may consist of various metal-oxide semiconductor (MOS) field-effect transistors (MOSFETs) arranged in a manner as to provide the desired logic operation. A MOSFET may be an n-channel MOSFET (nMOSFET) or a p-channel MOSFET (pMOSFET) depending on substrate materials.

In this regard, FIG. 1 illustrates an exemplary nMOSFET 100 that may be included in a logic gate. The nMOSFET 100 includes a metal gate (MG) 102, an n-type source region 104, an n-type drain region 106, and a p-type substrate (P-sub) (body) 108. A dielectric layer/interface layer 110 (e.g., a high-K dielectric layer/interface layer) is disposed between the metal gate 102 and the body 108. The metal gate 102, the n-type source region 104, and the n-type drain region 106 are coupled to a gate (G) electrode 112, a source (S) electrode 114, and a drain (D) electrode 116, respectively.

A gate voltage ($V_G$) 118 and a source voltage ($V_S$) 120 provide a switching voltage ($V_{GS}$) 122 that switches the nMOSFET 100 between an accumulation mode and an inversion mode. If the switching voltage ($V_{GS}$) 122 is less than a threshold voltage ($V_T$) of the nMOSFET 100, the nMOSFET 100 is in the accumulation mode or a depletion mode regardless of a drain voltage ($V_D$) 124. When the nMOSFET 100 is in the accumulation or the depletion mode, a channel region 126 between the n-type source region 104 and the n-type drain region 106 becomes highly resistive. As a result, no electrical current flows between the n-type source region 104 and the n-type drain region 106. When the switching voltage ($V_{GS}$) 122 is greater than or equal to the threshold voltage ($V_T$) of the nMOSFET 100, the nMOSFET 100 switches into an inversion mode, and the channel region 126 becomes conductive. In the inversion mode, if a drain-to-source voltage ($V_{DS}$) 128 is applied between the drain (D) electrode 108 and the source (S) electrode 106, electrons 130 are drawn to the n-type drain region 106 from the n-type source region 104, thus generating a switching electrical current ($I_D$) 132 flowing from the n-type drain region 106 to the n-type source region 104.

SUMMARY OF THE DISCLOSURE

Aspects disclosed in the detailed description include a three-dimensional (3D) ferroelectric dipole metal-oxide semiconductor (MOS) ferroelectric field-effect transistor (MOSFeFET) system. Related methods and systems are also disclosed. In exemplary aspects disclosed herein, the 3D ferroelectric dipole MOSFeFET system can function as a memory device (e.g., ferroelectric random access memory (FeRAM)) and be incorporated into a 3D integrated circuit (3DIC) to provide a high density memory system or array (e.g., 3D FeRAM). In exemplary aspects, the 3D ferroelectric dipole MOSFeFET system includes a bottom dielectric layer, a gate layer disposed on top of the bottom dielectric layer, and a top dielectric layer disposed on top of the gate layer. The 3D ferroelectric dipole MOSFeFET system also includes at least one source line (SL) line and at least one bit line (BL). At least one interconnect, which extends between the bottom dielectric layer and the top dielectric layer, interconnects the at least one SL with the at least one BL. A ferroelectric dipole MOSFeFET is formed at an intersection area of the at least one interconnect and the gate layer. In this regard, the 3D ferroelectric dipole MOSFeFET system can be fabricated to provide a plurality of ferroelectric dipole MOSFeFETs by including a plurality of interconnects and/or a plurality of gate layers, thus leading to improved component density and reduced footprint of the 3D ferroelectric dipole MOSFeFET system.

In this regard, in one aspect, a memory system is provided. The memory system includes a 3D ferroelectric dipole MOSFeFET system. The 3D ferroelectric dipole MOSFeFET system includes a bottom dielectric layer disposed above a substrate. The 3D ferroelectric dipole MOSFeFET system also includes at least one SL. The 3D ferroelectric dipole MOSFeFET system also includes a gate layer disposed above the bottom dielectric layer. The 3D ferroelectric dipole MOSFeFET system also includes a top dielectric layer disposed above the gate layer. The 3D ferroelectric dipole MOSFeFET system also includes at least one BL disposed such that the bottom dielectric layer, the gate layer, and the top dielectric layer are between the at least one SL and the at least on BL. The 3D ferroelectric dipole MOSFeFET system also includes at least one interconnect extending between the bottom dielectric layer and the top dielectric layer electrically interconnecting the at least one SL with the at least one BL. The 3D ferroelectric dipole MOSFeFET system also includes at least one ferroelectric dipole MOSFeFET formed at an intersection area of the at least one interconnect and the gate layer.

In another aspect, a memory system is provided. The memory system includes a means for forming a high-density ferroelectric dipole MOSFeFET system. The means for forming the high-density ferroelectric dipole MOSFeFET system includes a bottom dielectric layer disposed above a substrate. The means for forming the high-density ferroelectric dipole MOSFeFET system also includes at least one SL. The means for forming the high-density ferroelectric dipole MOSFeFET system also includes a gate layer disposed above the bottom dielectric layer. The means for forming the high-density ferroelectric dipole MOSFeFET system also includes a top dielectric layer disposed above the gate layer. The means for forming the high-density ferroelectric dipole MOSFeFET system also includes at least one BL disposed such that the bottom dielectric layer, the gate layer, and the top dielectric layer are between the at least one SL and the at least one BL. The means for forming the high-density ferroelectric dipole MOSFeFET system also includes at least one interconnect extending between the bottom dielectric layer and the top dielectric layer electrically interconnecting the at least one SL with the at least one BL. The means for forming the high-density ferroelectric dipole MOSFeFET system also includes at least one ferroelectric dipole MOSFeFET formed at an intersection area of the at least one interconnect and the gate layer.

In another aspect, a method for fabricating a 3D ferroelectric dipole MOSFeFET system is provided. The method includes providing a bottom dielectric layer above a substrate. The method also includes disposing at least one SL. The method also includes disposing a gate layer above the bottom dielectric layer. The method also includes disposing a top dielectric layer above the gate layer. The method also includes disposing at least one BL such that the bottom dielectric layer, the gate layer, and the top dielectric layer are between the at least one SL and the at least one BL. The method also includes disposing at least one interconnect extending between the bottom dielectric layer and the top dielectric layer electrically interconnecting the at least one SL with the at least one BL. The method also includes forming at least one ferroelectric dipole MOSFeFET at an intersection area of the at least one interconnect and the gate layer.

DETAILED DESCRIPTION

Figure 1:
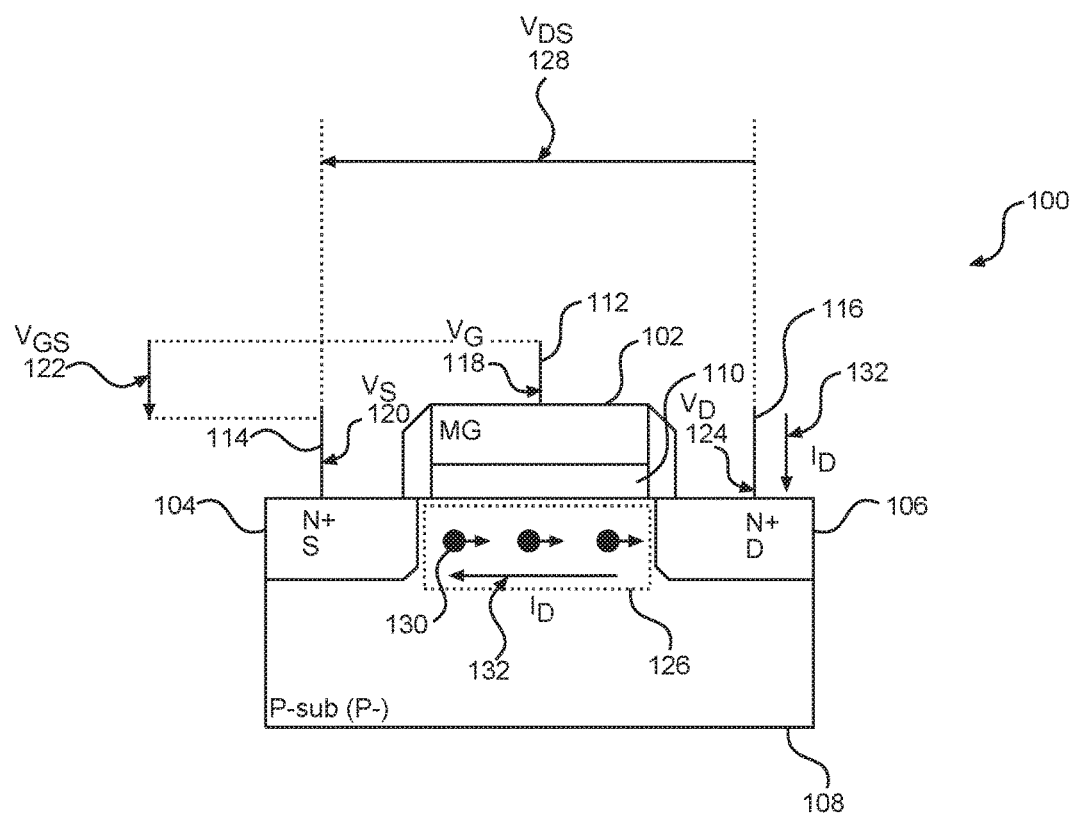
FIG. 1 illustrates an exemplary n-channel metal-oxide semiconductor (MOS) ferroelectric field-effect transistor (MOSFeFET) (nMOSFeFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a three-dimensional (3D) ferroelectric dipole metal-oxide semiconductor (MOS) ferroelectric field-effect transistor (MOSFeFET) system. Related methods and systems are also disclosed. In exemplary aspects disclosed herein, the 3D ferroelectric dipole MOSFeFET system can function as a memory device (e.g., ferroelectric random access memory (FeRAM)) and be incorporated into a 3D integrated circuit (3DIC) to provide a high density memory system or array (e.g., 3D FeRAM). In exemplary aspects, the 3D ferroelectric dipole MOSFeFET system includes a bottom dielectric layer, a gate layer disposed on top of the bottom dielectric layer, and a top dielectric layer disposed on top of the gate layer. The 3D ferroelectric dipole MOSFeFET system also includes at least one source line (SL) line and at least one bit line (BL). At least one interconnect, which extends between the bottom dielectric layer and the top dielectric layer, interconnects the at least one SL with the at least one BL. A ferroelectric dipole MOSFeFET is formed at an intersection area of the at least one interconnect and the gate layer. In this regard, the 3D ferroelectric dipole MOSFeFET system can be fabricated to provide a plurality of ferroelectric dipole MOSFeFETs by including a plurality of interconnects and/or a plurality of gate layers, thus leading to improved component density and reduced footprint of the 3D ferroelectric dipole MOSFeFET system.

Figure 2A:
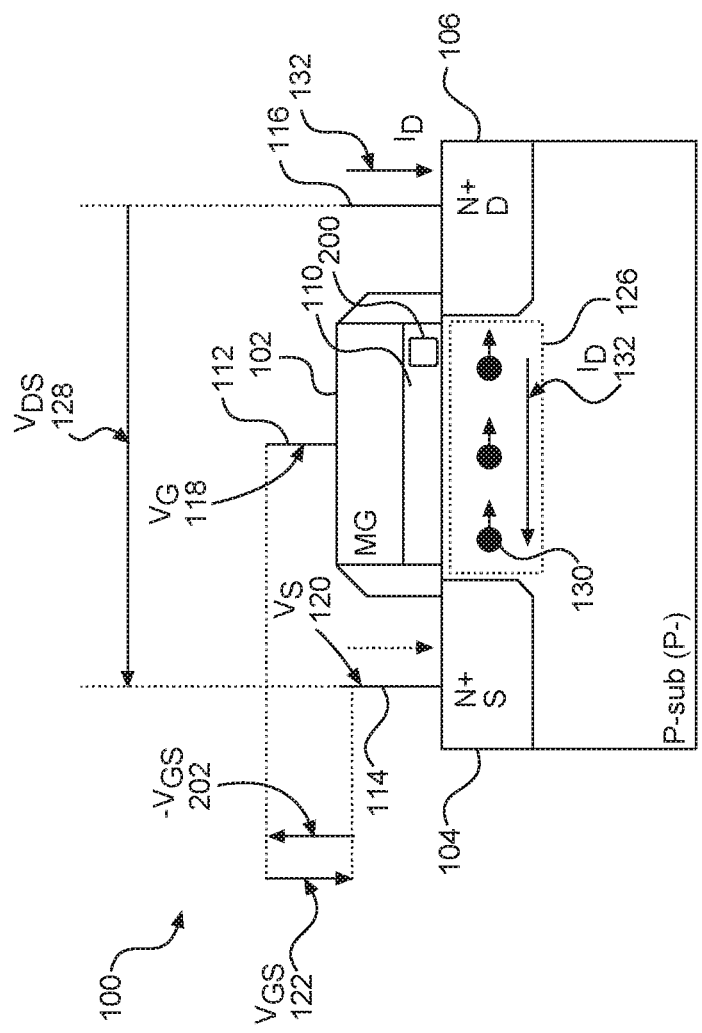
FIG. 2A is an exemplary schematic diagram illustrating a charge trap generated when the nMOSFeFET of FIG. 1 is programmed based on a MOS operation.
Figure 2B:
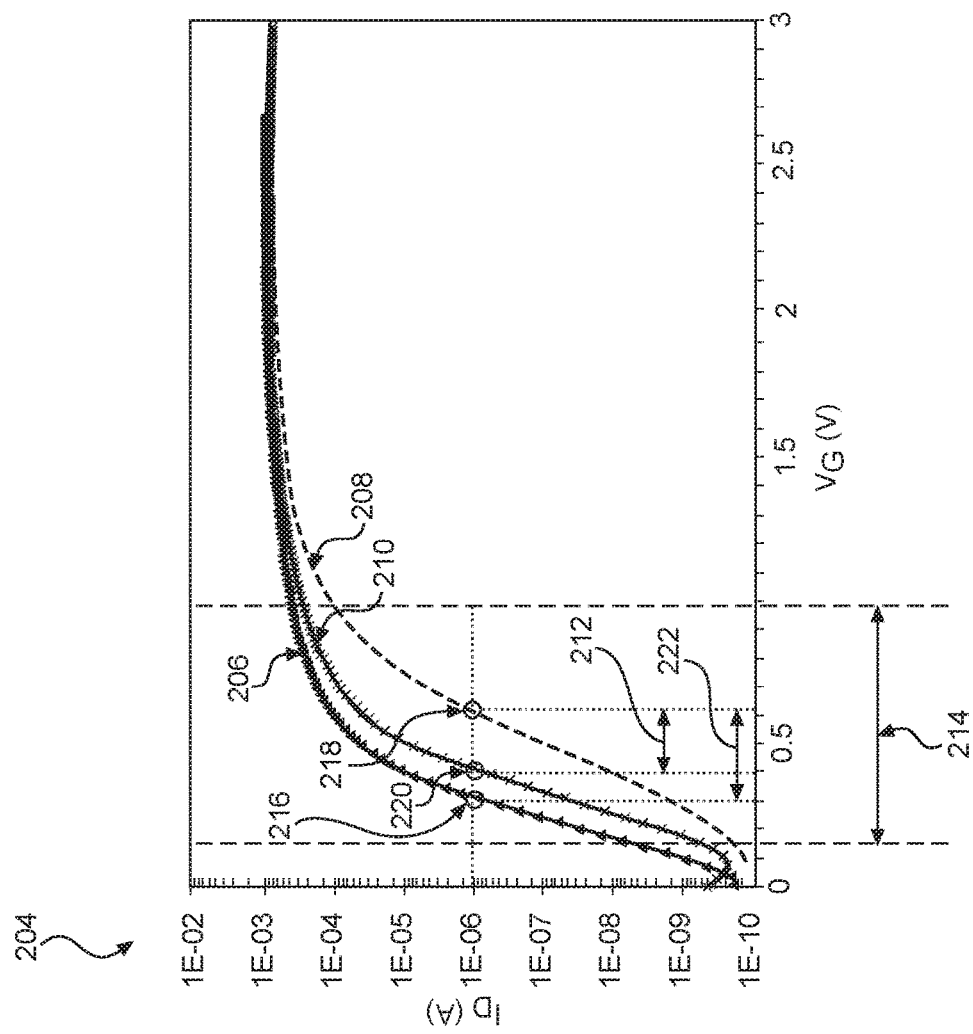
FIG. 2B is an exemplary drain-current-vs-switching-voltage ($I_D$-$V_{GS}$) curve illustrating an exemplary impact of the charge trap on the nMOSFeFET of FIG. 2A.
Figure 2C:
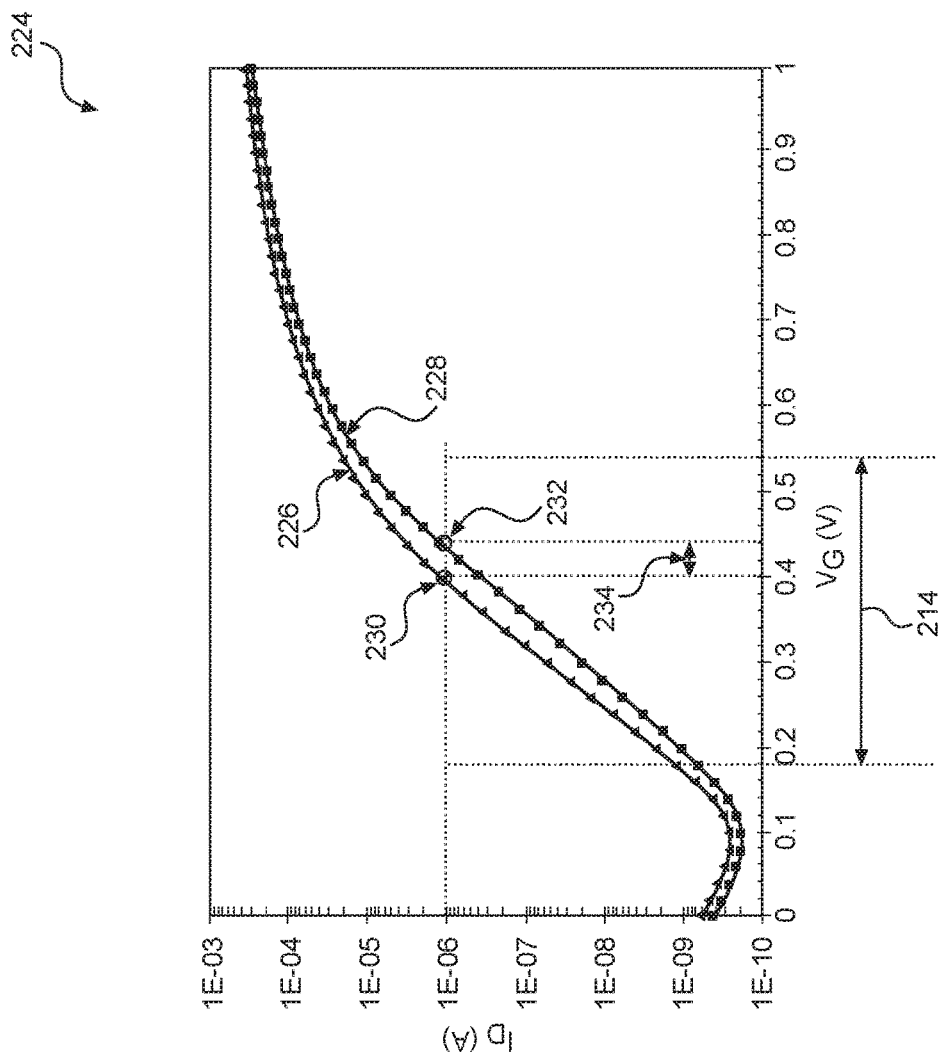
FIG. 2C is an exemplary $I_D$-$V_{GS}$ curve illustrating inconsistent voltage readings from a drain electrode and a source electrode of the nMOSFeFET of FIG. 2A due to the impact of the charge trap.

Before discussing exemplary aspects of a 3D ferroelectric dipole MOSFeFET system configured to reduce or eliminate charge trap during programming and erasing operations, an overview of the charge trap phenomenon in a MOSFeFET and effects of the charge trap are provided with reference to FIGS. 2A-2C. The discussion of specific exemplary aspects of the 3D ferroelectric dipole MOSFeFET system starts below with reference to FIG. 3A.

In this regard, FIG. 2A is a schematic diagram illustrating a charge trap 200 generated when the nMOSFeFET 100 of FIG. 1 is programmed based on a MOS operation. Common elements between FIGS. 1 and 2A are shown therein with common element numbers and will not be re-described herein.

With reference to FIG. 2A, when the switching voltage ($V_{GS}$) 122 is equal to or greater than the threshold voltage ($V_T$) of the nMOSFeFET 100, the channel region 126 of the nMOSFeFET 100 becomes conductive. With the presence of the drain-to-source voltage ($V_{DS}$) 128 applied between the drain electrode 116 and the source electrode 114, the electrons 130 are drawn from the n-type source region 104 to the n-type drain region 106 such that the switching electrical current ($I_D$) 132 flows from the n-type drain region 106 to the n-type source region 104. Consequently, some of the electrons 130 (also referred to as "hot carriers") gain enough kinetic energy to be injected into and trapped in the dielectric layer/interface layer 110, thus forming the charge trap 200 in the nMOSFeFET 100. The charge trap 200 reduces a switching window, which indicates a differential between a pre-switching threshold voltage and a post-switching threshold voltage, and endurance of the nMOSFeFET 100, thus reducing reliability in accessing information stored in the nMOSFeFET 100. Moreover, the charge trap 200 may remain in the dielectric layer/interface layer 110 for very long period of time and cannot be erased by a reverse switching voltage ($-V_{GS}$) 202.

FIG. 2B is an exemplary drain-current-vs-switching-voltage ($I_D$-$V_{GS}$) curve 204 illustrating the impact of the charge trap 200 on the nMOSFeFET 100 of FIG. 2A. Common elements between FIGS. 2A and 2B are shown therein with common element numbers and will not be re-described herein. Given that the dielectric layer/interface layer 110 in the nMOSFeFET 100 may be switched like a regular ferroelectric dipole switch, it may be possible to analyze the regular ferroelectric dipole device based on the nMOSFeFET 100.

The $I_D$-$V_{GS}$ curve 204 includes a pre-programming curve 206, a post-programming curve 208, and a post-erasing curve 210. Jointly, the pre-programming curve 206, the post-programming curve 208, and the post-erasing curve 210 illustrate a reduced switching window 212 resulting from the charge trap 200 in the nMOSFeFET 100. When the switching voltage ($V_{GS}$) 122 that is equal to or greater than the threshold voltage ($V_T$) is applied to program the nMOSFeFET 100, the pre-programming curve 206, which represents the pre-switching threshold voltage, shifts toward the post-programming curve 208, which represents the post-switching threshold voltage. The post-programming curve 208 is expected to return to the pre-programming curve 206 to represent the pre-switching threshold voltage when the nMOSFeFET 100 is erased with the reverse switching voltage ($-V_{GS}$) 202. However, due to existence of the charge trap 200 in the dielectric layer/interface layer 110, the post-programming curve 208 only returns to the post-erasing curve 210, as opposed to the pre-programming curve 206. To further explain the cause of the post-programming curve 208 not returning to the pre-programming curve 206 inside an inversion region 214, Equation 1 (Eq. 1) is provided and discussed below.

$$V_\tau = V_{fb} + 2\psi_B + \frac{q(N_a + D_{it} + D_{c\tau})W_{dm}}{C_{ox}} + \frac{qD_I}{C_{o\tau}} \quad (Eq.\ 1)$$

For the nMOSFeFET 100, it may be assumed that $\rho_{ox} = P_r = \pm nqd$ ($d < t_{ox}$). Accordingly, Equation 1 (Eq. 1) can be transformed into Equation 2 (Eq. 2) below.

$$V_{fb} = \phi_{MS} - \frac{Q_i}{C_{ox}} - \frac{1}{\varepsilon_{ox}} \int_0^{t_{ox}} \rho_{ox}(x)x\,dx = \phi_{MS} - \frac{Q_i}{C_{ox}} \mp \frac{nqd}{2\varepsilon_{ox}} t_{ox}^2 \quad (Eq.\ 2)$$

With reference to Eq. 1 above, when the nMOSFeFET 100 is programmed, the flat-band voltage ($V_{fb}$) will change accordingly. However, the flat-band voltage ($V_{fb}$) will not cause changes in sub-threshold slope. An increase in flat-band voltage ($V_{fb}$) in Eq. 2, which is related to the inherent characteristics of the nMOSFeFET 100, drives the pre-programming curve 206 toward the post-programming curve 208. To facilitate the discussion, a pre-switch threshold voltage 216 on the pre-programming curve 206, a post-switch threshold voltage 218 on the post-programming curve 208, and a post-erase threshold voltage 220 on the post-erasing curve 210 are referenced herein. The rightward movement of the post-programming curve 208 causes the pre-switch threshold voltage 216 to move to the post-switch threshold voltage 218 due to the increase in the flat-band voltage ($V_{fb}$). In an ideal situation, the flat-band voltage ($V_{fb}$) will decrease when the reverse switching voltage ($-V_{GS}$) 202 erases the nMOSFeFET 100, thus bringing the post-programming curve 208 back to the pre-programming curve 206 and returning the post-switch threshold voltage 218 to the pre-switch threshold voltage 216. However, due to the existence of the charge trap 200, which is represented by an oxide trap $D_{ot}$ in Eq. 1, the sub-threshold slope and the voltage $V_T$ are subject to change. As a result, the post-erasing curve 210 does not return all the way back to the pre-programming curve 206. As a result, the post-erase threshold voltage 220 settles in between the pre-switch threshold voltage 216 and the post-switch threshold voltage 218. Consequently, an ideal switching window 222 of the nMOSFeFET 100 is shortened to the reduced switching window 212. As a result, switching endurance is shortened, thus compromising and decreasing the reliability and performance of the nMOSFeFET 100, as further illustrated below in FIG. 2C.

In this regard, FIG. 2C is an exemplary $I_D$-$V_{GS}$ curve 224 illustrating inconsistent voltage readings from the drain electrode 116 and the source electrode 114 of the nMOSFeFET 100 of FIG. 2A due to the impact of the charge trap 200. Common elements between FIGS. 2A and 2C are shown therein with common element numbers and will not be re-described herein.

With reference to FIG. 2C, the $I_D$-$V_{GS}$ curve 224 includes a drain-side-read $I_D$-$V_{GS}$ curve 226 and a source-side-read $I_D$-$V_{GS}$ curve 228. The drain-side-read $I_D$-$V_{GS}$ curve 226 illustrates threshold voltage ($V_T$) readings when the drain-to-source voltage ($V_{DS}$) 128 is applied as a positive voltage. The source-side-read $I_D$-$V_{GS}$ curve 228, on the other hand, illustrates threshold voltage ($V_T$) readings when the drain-to-source voltage ($V_{DS}$) 128 is applied as a negative voltage. The drain-side-read $I_D$-$V_{GS}$ curve 226 and the source-side-read $I_D$-$V_{GS}$ curve 228 should converge if the charge trap 200 is non-existent. However, as shown in the $I_D$-$V_{GS}$ curve 224, at any $I_D$ current level inside the inversion region 214, a drain-side-read $V_T$ 230 is different from a source-side-read $V_T$ 232. A $V_T$ differential 234 indicates a potential inaccuracy in accessing the information stored in the nMOSFeFET 100 due to the existence of the charge trap 200. As such, it may be desirable to prevent the charge trap 200 from building up in the nMOSFeFET 100 when the nMOSFeFET 100 is programmed.

U.S. Pat. No. 9,413,349 B1, entitled "HIGH-K (HK)/ METAL GATE (MG) (HK/MG) MULTI-TIME PROGRAMMABLE (MTP) SWITCHING DEVICES, AND RELATED SYSTEMS AND METHODS" to Li et al., which issued on Aug. 9, 2016, describes a MTP MOSFET that can be programmed by an electric field to eliminate a switching electrical current. By eliminating the switching electrical current during MTP MOSFET programming, it is possible to avoid a charge trap in the MTP MOSFET, thus restoring the switching window and the endurance of the MTP MOSFET for more reliable information access. As discussed below, a 3D ferroelectric dipole MOSFeFET system can be fabricated to include a plurality of ferroelectric dipole MOSFeFETs to achieve higher component density. In addition, each ferroelectric dipole MOSFeFET in the 3D ferroelectric dipole MOSFeFET system can be programmed by an electric field to prevent a switching electrical current (e.g., the switching electrical current ($I_D$) 132 of FIG. 2A) from generating a charge trap (e.g., the charge trap 200 of FIG. 2A) in the ferroelectric dipole MOSFeFET, thus restoring the switching window and the endurance of the ferroelectric dipole MOSFeFET for more reliable information access.

Figure 3A:
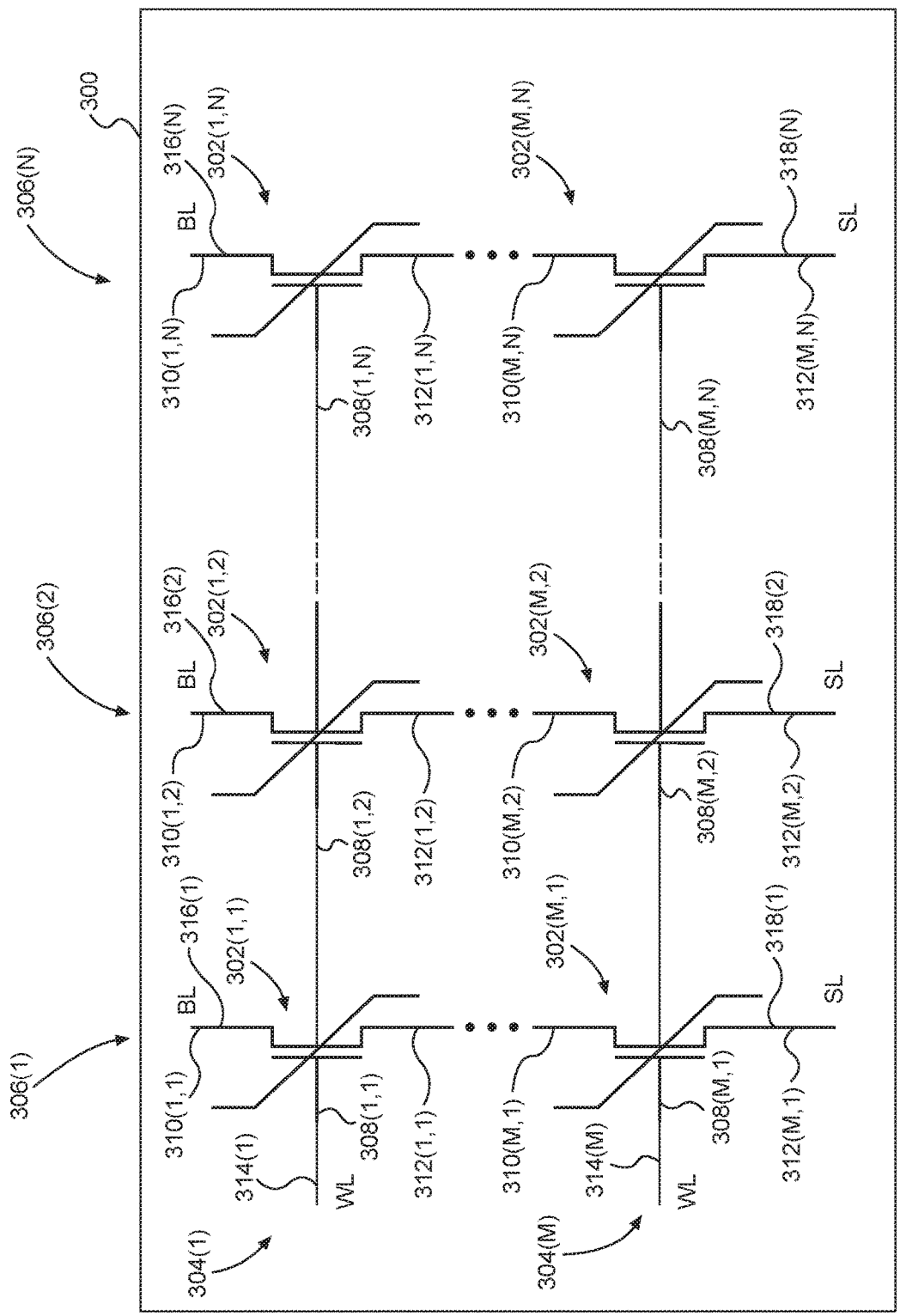
FIG. 3A is a schematic diagram of an exemplary ferroelectric dipole MOSFeFET circuit that can be fabricated in a three-dimensional (3D) integrated circuit (3DIC)

In this regard, FIG. 3A is a schematic diagram of an exemplary ferroelectric dipole MOSFeFET circuit 300 that can be fabricated into a 3D integrated circuit (3DIC). In a non-limiting example, a 3DIC can be a semiconductor die in which two or more semiconductor layers consisting of active and/or passive electronic components are interconnected vertically and/or horizontally to form an IC. The ferroelectric dipole MOSFeFET circuit 300 includes a plurality of ferroelectric dipole MOSFeFETs 302(1,1)-302(M,N) that can be arranged to form one or more rows 304(1)-304(M) and one or more columns 306(1)-306(N). The ferroelectric dipole MOSFeFETs 302(1,1)-302(M,N) have a plurality of gate electrodes 308(1,1)-308(M,N), a plurality of drain electrodes 310(1,1)-310(M,N), and a plurality of source electrodes 312(1,1)-312(M,N), respectively. The gate electrodes 308(1,1)-308(M,N) are coupled to a plurality of word lines (WLs) 314(1)-314(M) that correspond to the rows 304(1)-304(M), respectively. In a non-limiting example, the WLs 314(1)-314(M) can be provided as metallic or polycrystalline (poly) silicon (poly-Si) lines in the ferroelectric dipole MOSFeFET circuit 300. The drain electrodes 310(1,1)-310(M,N) are coupled to a plurality of bit lines (BLs) 316(1)-316(N) that correspond to the columns 306(1)-306(N), respectively. The source electrodes 312(1,1)-312(M,N) are coupled to a plurality of source lines (SLs) 318(1)-318(N) that correspond to the columns 306(1)-306(N), respectively. In a non-limiting example, the BLs 316(1)-316(N) and the SLs 318(1)-318(N) can be provided as metallic strips in the ferroelectric dipole MOSFeFET circuit 300.

To program a selected ferroelectric dipole MOSFeFET, for example, the ferroelectric dipole MOSFeFET 302(1,1), in the ferroelectric dipole MOSFeFET circuit 300, a controller would enable the WL 314(1), the BL 316(1), and the SL 318(1). Accordingly, the selected ferroelectric dipole MOSFeFET is programmed by an electric field to reduce or eliminate a charge trap, such as the charge trap 200 in FIG. 2A, to provide more reliable information access in the ferroelectric dipole MOSFeFET circuit 300. Further, as discussed next in FIGS. 3B-3D, the ferroelectric dipole MOSFeFET circuit 300 can be fabricated into a 3D ferroelectric dipole MOSFeFET system to help improve component density and reduce footprint.

Figure 3B:
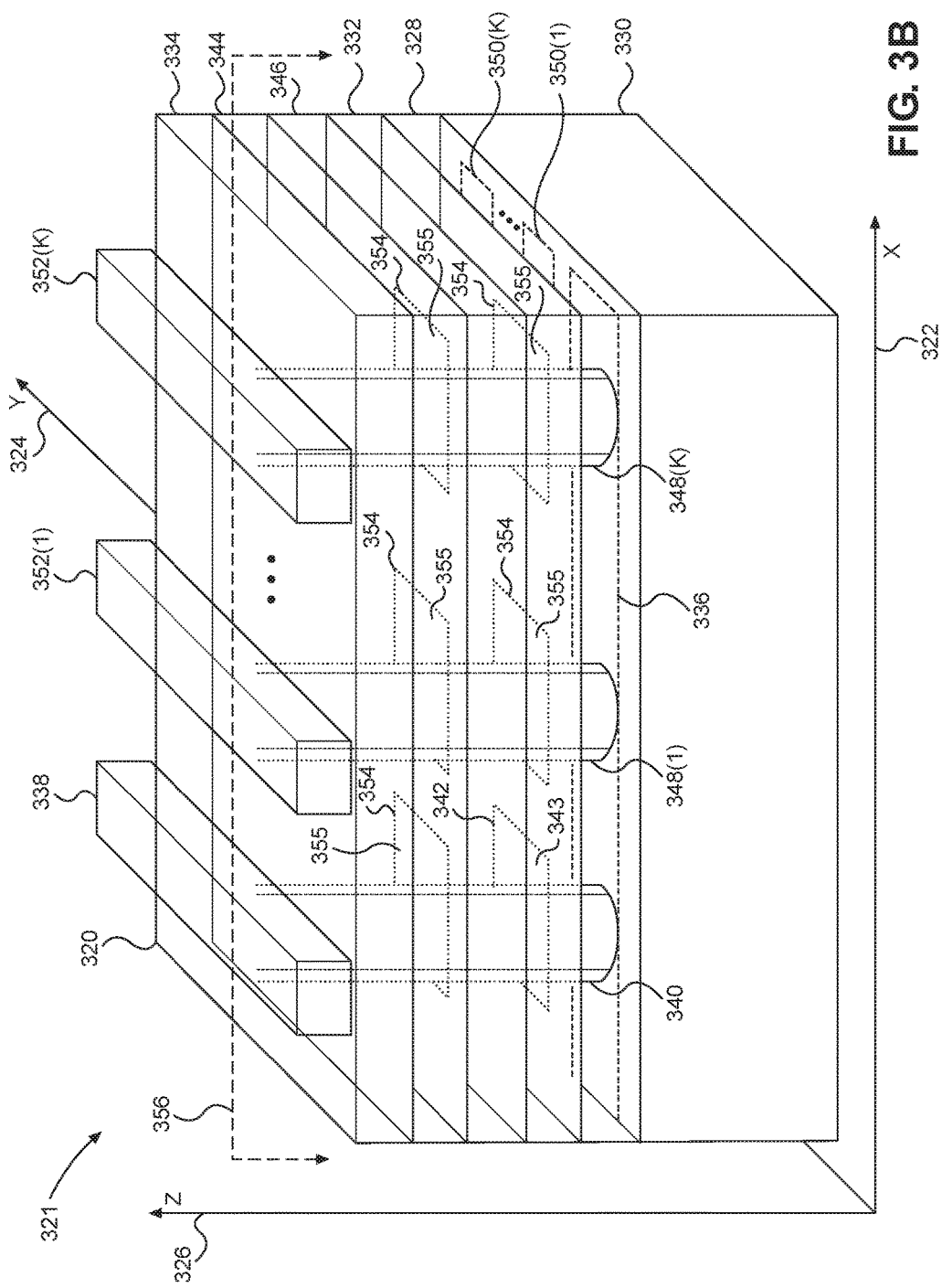
FIG. 3B is a schematic diagram of an exemplary 3D ferroelectric dipole MOSFeFET system fabricated to include the ferroelectric dipole MOSFeFET circuit of FIG. 3A for improved component density and reduced footprint.

In this regard, FIG. 3B is a schematic diagram of an exemplary 3D ferroelectric dipole MOSFeFET system 320 fabricated to include the ferroelectric dipole MOSFeFET circuit 300 of FIG. 3A for improved component density and reduced footprint. In a non-limiting example, the 3D ferroelectric dipole MOSFeFET system 320 provides a means for forming a high-density ferroelectric dipole MOSFeFET system. For the convenience and clarity of illustration and description, the 3D ferroelectric dipole MOSFeFET system 320 is discussed hereinafter with reference to a 3D coordinate system 321 including an x-axis 322, a y-axis 324, and a z-axis 326. Notably, orientation-related phrases, such as "top," "bottom," "above," "below," and "vertical," are used hereinafter in relative to the z-axis 326.

With reference to FIG. 3B, the 3D ferroelectric dipole MOSFeFET system 320 can be fabricated to include a bottom dielectric layer 328 disposed above a substrate 330, a gate layer 332 disposed above the bottom dielectric layer 328, and a top dielectric layer 334 disposed above the gate layer 332. In a non-limiting example, the bottom dielectric layer 328 is formed by a dielectric material, which can be an inter-layer dielectric (ILD). The 3D ferroelectric dipole MOSFeFET system 320 can include at least one SL 336 and at least one BL 338. In one non-limiting example, the BL 338 is disposed below the bottom dielectric layer 328, and the SL 336 is disposed above the top dielectric layer 334 perpendicular to the BL 338. In another non-limiting example, the SL 336 is disposed below the bottom dielectric layer 328, and the BL 338 is disposed above the top dielectric layer 334 perpendicular to the SL 336. For the convenience of reference and illustration, the 3D ferroelectric dipole MOSFeFET system 320 discussed hereinafter is based on the SL 336 being disposed below the bottom dielectric layer 328, and the BL 338 being disposed above the top dielectric layer 334. It shall be appreciated that the configuration and operational principles discussed herein are applicable to the 3D ferroelectric dipole MOSFeFET system 320 having the BL 338 disposed below the bottom dielectric layer 328 and the SL 336 disposed above the top dielectric layer 334 as well. The 3D ferroelectric dipole MOSFeFET system 320 includes at least one interconnect 340 extending between the bottom dielectric layer 328 and the top dielectric layer 334 electrically interconnecting the SL 336 with the BL 338. As shown in FIG. 3B as a non-limiting example, the interconnect 340 can extend vertically from the bottom dielectric layer 328 to the top dielectric layer 334. The interconnect 340 can be a silicon (e.g., doped silicon or poly silicon) fill material, for example, interconnecting multiple semiconductor layers to form multiple vertical MOS transistors in a 3DIC. As such, the interconnect 340 can provide an electrical interconnect between multiple vertical devices disposed in different semiconductor layers in the 3DIC. In this regard, at least one ferroelectric dipole MOSFeFET 342, which can be any of the ferroelectric dipole MOSFeFETs 302(1,1)-302(M,N) of FIG. 3A, is formed at an intersection area 343 of the interconnect 340 and the gate layer 332. As is further discussed below with reference to FIGS. 3B-3D, the 3D ferroelectric dipole MOSFeFET system 320 can be fabricated to form any number of ferroelectric dipole MOSFeFETs, such as the ferroelectric dipole MOSFeFET 342, to help improve component density and reduce footprint of the 3D ferroelectric dipole MOSFeFET system 320.

Figure 4:
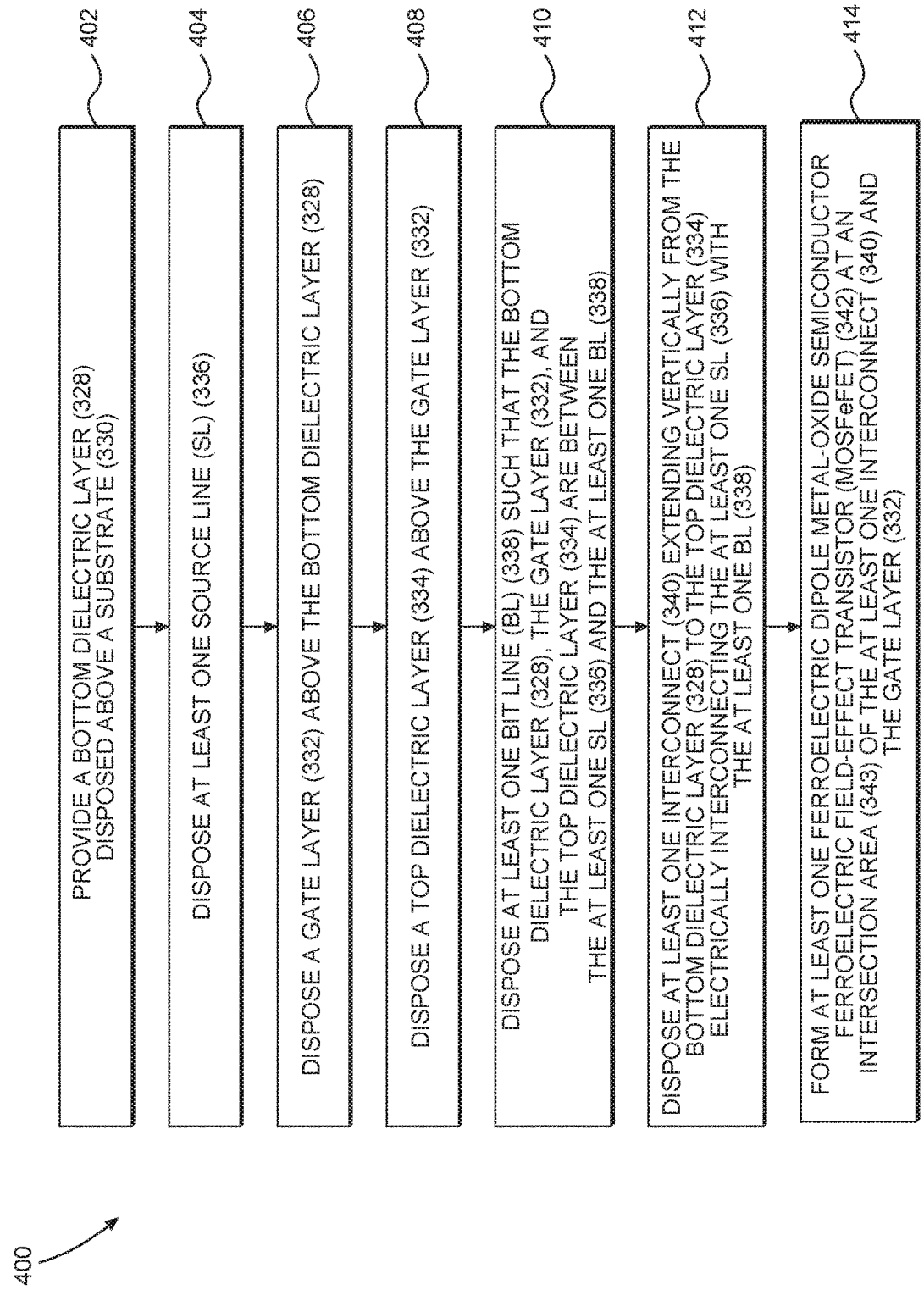
FIG. 4 is a flowchart of an exemplary process for fabricating the 3D ferroelectric dipole MOSFeFET system of FIG. 3B.

The 3D ferroelectric dipole MOSFeFET system 320 can be fabricated according to a fabrication process. In this regard, FIG. 4 is a flowchart of an exemplary process 400 for fabricating the 3D ferroelectric dipole MOSFeFET system 320 of FIG. 3B. The process 400 includes providing the bottom dielectric layer 328 disposed above the substrate 330 (block 402). The process 400 also includes disposing the SL 336 (block 404). The process 400 also includes disposing the gate layer 332 above the bottom dielectric layer 328 (block 406). The process 400 also includes disposing the top dielectric layer 334 above the gate layer 332 (block 408). The process 400 also includes disposing the BL 338 such that the bottom dielectric layer 328, the gate layer 332, and the top dielectric layer 334 are between the SL 336 and the BL 338(block 410). The process 400 also includes disposing the interconnect 340 extending vertically from the bottom dielectric layer 328 to the top dielectric layer 334 electrically interconnecting the SL 336 with the BL 338 (block 412). The process 400 also includes forming the ferroelectric dipole MOSFeFET 342 at the intersection area 343 of the interconnect 340 and the gate layer 332 (block 414).

With reference back to FIG. 3B, the 3D ferroelectric dipole MOSFeFET system 320 can be fabricated to include any number of the ferroelectric dipole MOSFeFETs 302(1,1)-302(M,N) of FIG. 3A in the ferroelectric dipole MOSFeFET circuit 300 by including at least one additional gate layer 344, at least one additional dielectric layer 346, one or more additional interconnects 348(1)-348(K), one or more additional SLs 350(1)-350(K), and one or more additional BLs 352(1)-352(K). The additional dielectric layer 346 is disposed above the gate layer 332. The additional gate layer 344 is disposed between the additional dielectric layer 346 and the top dielectric layer 334.

The SL 336 and the additional SLs 350(1)-350(K) are disposed in parallel below the bottom dielectric layer 328. The BL 338 and the additional BLs 352(1)-352(K) are disposed in parallel above the top dielectric layer 334. The BL 338 and the additional BLs 352(1)-352(K) are perpendicular to the SL 336 and the additional SLs 350(1)-350(K). The additional interconnects 348(1)-348(K) each extend vertically from the bottom dielectric layer 328 to the top dielectric layer 334 electrically interconnecting a respective SL among the additional SLs 350(1)-350(K) with a respective BL among the additional BLs 352(1)-352(K). Although FIG. 3B illustrates one interconnect for the BL 338 and each of the additional BLs 352(1)-352(K), it shall be appreciated that more than one interconnect can be included for the BL 338 and each of the additional BLs 352(1)-352(K). Accordingly, one or more additional ferroelectric dipole MOSFeFETs 354 can be formed at one or more intersection areas 355 between the interconnect 340 and the additional gate layer 344, between the additional interconnects 348(1)-348(K) and the gate layer 332, and between the additional interconnects 348(1)-348(K) and the additional gate layer 344. By forming the additional ferroelectric dipole MOSFeFETs 354, it is possible to fabricate the 3D ferroelectric dipole MOSFeFET system 320 with increased component density to help reduce the footprint of the 3D ferroelectric dipole MOSFeFET system 320.

Figure 3C:
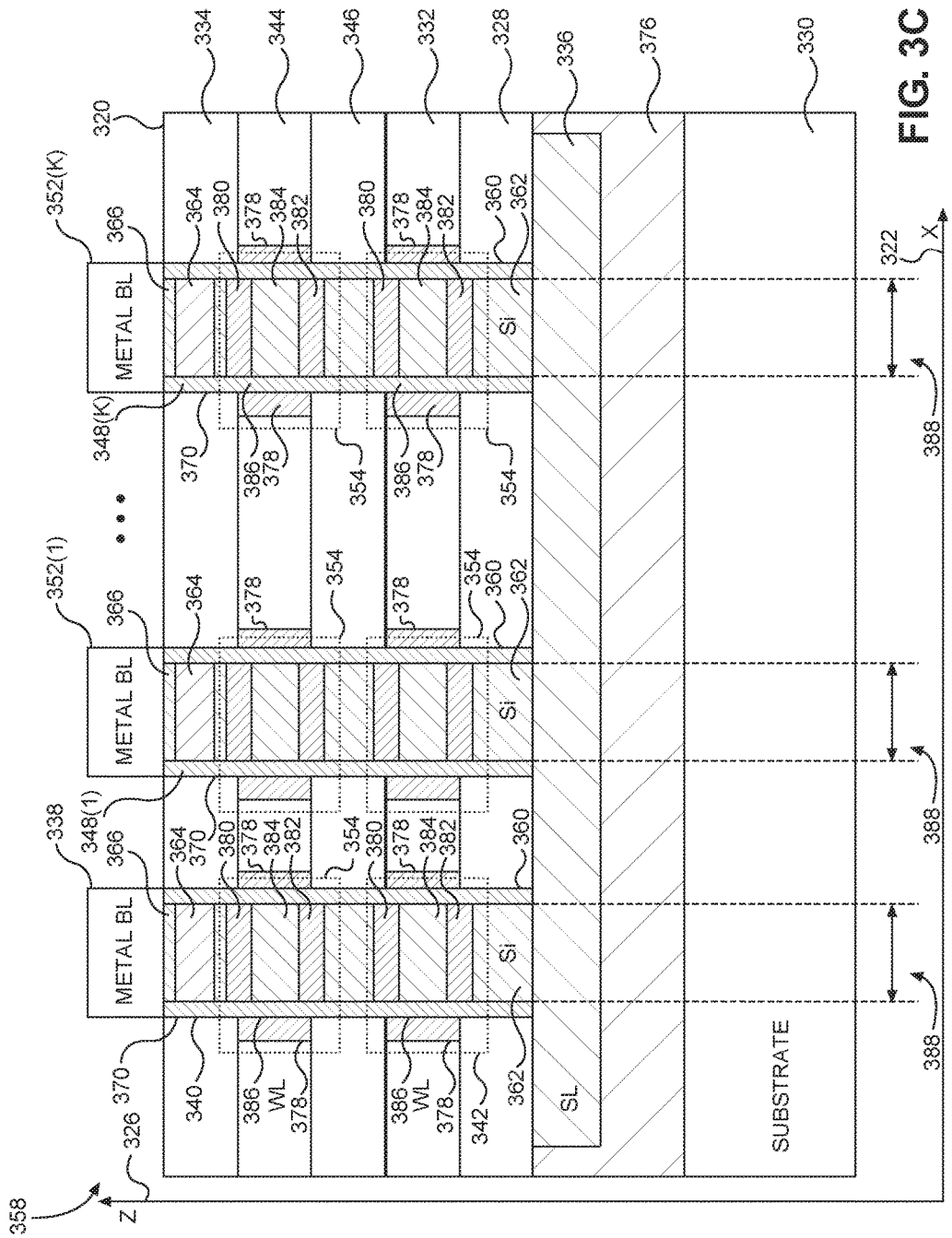
FIG. 3C is a schematic diagram of an exemplary side view of the 3D ferroelectric dipole MOSFeFET system of FIG. 3B.

To help illustrate the inner structure of the interconnect 340 and the additional interconnects 348(1)-348(K), a side view of the 3D ferroelectric dipole MOSFeFET system 320, which is produced along a cut-line 356 as shown in FIG. 3B, is discussed next. In this regard, FIG. 3C is a schematic diagram of an exemplary side view 358 of the 3D ferroelectric dipole MOSFeFET system 320 of FIG. 3B. Common elements between FIGS. 3B and 3C are shown therein with common element numbers and will not be re-described herein.

With reference to FIG. 3C, in a non-limiting example, the interconnect 340 and the additional interconnects 348(1)-348(K) are provided as cylindrical-shaped through-layer silicon bars or cylindrical-shaped through-layer poly silicon bars. In this regard, the interconnect 340 and the additional interconnects 348(1)-348(K) each include a hollow cylinder sidewall 360, a through-layer silicon bar 362, a silicon bar-top 364, and a silicide layer 366. In a non-limiting example, the through-layer silicon bar 362 can be formed by filling the hollow cylinder sidewall 360 with silicon (e.g., P-doped or N-doped silicon). To help visualize the hollow cylinder sidewall 360, a top-down view of the 3D ferroelectric dipole MOSFeFET system 320 of FIG. 3B is discussed next.

Figure 3D:
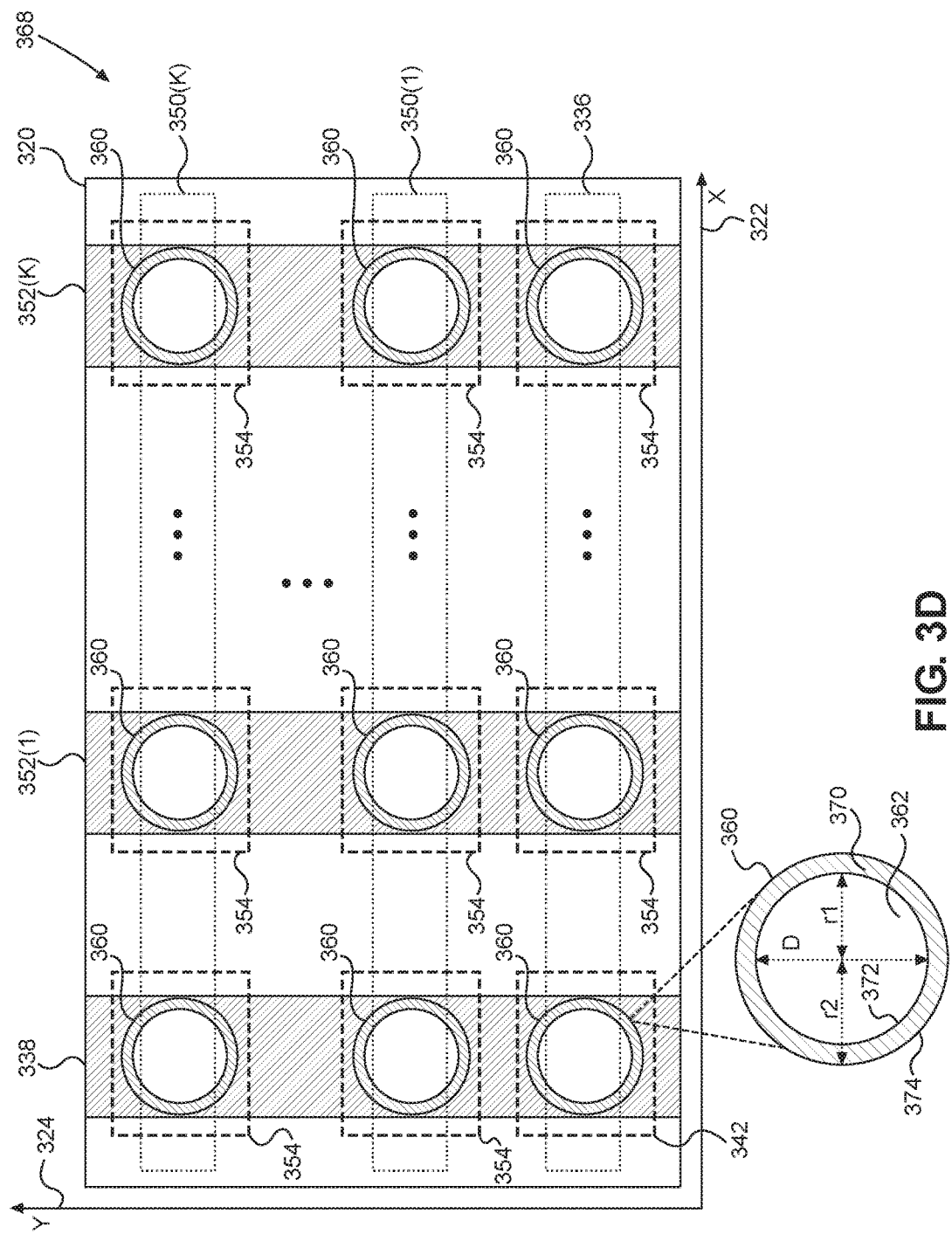
FIG. 3D is a schematic diagram of an exemplary top-down view of the 3D ferroelectric dipole MOSFeFET system of FIG. 3B.

In this regard, FIG. 3D is a schematic diagram of an exemplary top-down view 368 of the 3D ferroelectric dipole MOSFeFET system 320 of FIG. 3B. Common elements between FIGS. 3B, 3C, and 3D are shown therein with common element numbers and will not be re-described herein. The hollow cylinder sidewall 360 includes a ferroelectric annulus 370 bounded by an inner circular cylinder 372 that corresponds to an inner radius r1 and an outer circular cylinder 374 that corresponds to an outer radius r2. The outer radius r2 is larger than the inner radius r1. The ferroelectric annulus 370 of the hollow cylinder sidewall 360 may be formed by ferroelectric material such as Hafnium (Hf) oxide (Ox) doped with Aluminum (Al) (HfAlOx), Hafnium (Hf) oxide (Ox) doped with Zirconium (Zr) (HfZrOx), or Hafnium (Hf) oxide (Ox) doped with Silicon (Si) (HfSiOx). The through-layer silicon bar 362 can be disposed inside the hollow cylinder sidewall 360. In a non-limiting example, the through-layer silicon bar 362 fills the inner circular cylinder 372 of the hollow cylinder sidewall 360. As such, the through-layer silicon bar 362 has a diameter D that equals approximately two times the inner radius r1 (D=2× r1).

As shown in FIG. 3D, the BL 338 and the additional BLs 352(1)-352(K) are disposed parallel to each other. Likewise, the SL 336 and the additional SLs 350(1)-350(K) are disposed parallel to each other. In addition, the BL 338 and the additional BLs 352(1)-352(K) are perpendicular to the SL 336 and the additional SLs 350(1)-350(K).

With reference back to FIG. 3C, the through-layer silicon bar 362 in the interconnect 340 and the additional interconnects 348(1)-348(K) is coupled to the SL 336. The silicon bar-top 364 is disposed on top of the through-layer silicon bar 362, and the silicide layer 366 is disposed between the silicon bar-top 364 and a respective BL among the BL 338 and the additional BLs 352(1)-352(K). The 3D ferroelectric dipole MOSFeFET system 320 includes an isolation layer 376 disposed between the bottom dielectric layer 328 and the substrate 330.

In one non-limiting example, the 3D ferroelectric dipole MOSFeFET system 320 is fabricated to form an n-type 3D ferroelectric dipole MOSFeFET system. Accordingly, the through-layer silicon bar 362 is p-minus (P−) doped, and the silicon bar-top 364 is p-plus (P+) doped. The SL 336 and the additional SLs 350(1)-350(K) are P+ doped. The gate layer 332 and the additional gate layer 344 are provided as P+ poly layers, p-type metal gate layers, n-plus (N+) poly layers, or n-type metal gate layers. The BL 338 and the additional BLs 352(1)-352(K) are provided as metal BLs.

The substrate 330 is provided as a P− substrate. The isolation layer 376 is provided as an n-minus (N−) well (NW) or an oxide layer.

In another non-limiting example, the 3D ferroelectric dipole MOSFeFET system 320 is fabricated to form a p-type 3D ferroelectric dipole MOSFeFET system. Accordingly, the through-layer silicon bar 362 is N− doped, and the silicon bar-top 364 is N+ doped. The SL 336 and the additional SLs 350(1)-350(K) are N+ doped. The gate layer 332 and the additional gate layer 344 are provided as N+ poly layers, n-type metal gate layers, P+ poly layers, or p-type metal gate layers. The BL 338 and the additional BLs 352(1)-352(K) are provided as metal BLs. The substrate 330 is provided as a P− substrate. The isolation layer 376 is provided as a P− well (PW) or an oxide layer.

With continuing reference to FIG. 3C, the ferroelectric dipole MOSFeFET 342 has a gate electrode 378 formed by the gate layer 332 surrounding the through-layer silicon bar 362. The ferroelectric dipole MOSFeFET 342 has a drain electrode 380 and a source electrode 382 both formed by the through-layer silicon bar 362. The drain electrode 380 is coupled to the BL 338 through the through-layer silicon bar 362 and/or any other ferroelectric dipole MOSFeFET(s) disposed above the ferroelectric dipole MOSFeFET 342, and the source electrode 382 is coupled to the SL 336 through the through-layer silicon bar 362 and/or any other ferroelectric dipole MOSFeFET(s) disposed below the ferroelectric dipole MOSFeFET 342. The ferroelectric dipole MOSFeFET 342 has a channel region 384, which is also formed by the through-layer silicon bar 362, between the drain electrode 380 and the source electrode 382. The ferroelectric dipole MOSFeFET 342 has a ferroelectric layer 386 that is formed by the ferroelectric annulus 370 of the hollow cylinder sidewall 360 between the gate electrode 378 and the channel region 384.

Likewise, the additional ferroelectric dipole MOSFeFETs 354 each have the gate electrode 378 formed by the gate layer 332 surrounding the through-layer silicon bar 362. The additional ferroelectric dipole MOSFeFETs 354 each have the drain electrode 380 and the source electrode 382, which are both formed by the through-layer silicon bar 362. The drain electrode 380 is coupled to a respective BL among the additional BLs 352(1)-352(K) through the through-layer silicon bar 362 and/or any other ferroelectric dipole MOSFeFET(s) disposed above the additional ferroelectric dipole MOSFeFET 354, and the source electrode 382 is coupled to a respective SL among the additional SLs 350(1)-350(K) of FIG. 3B through the through-layer silicon bar 362 and/or any other ferroelectric dipole MOSFeFET(s) disposed below the additional ferroelectric dipole MOSFeFET 354. The additional ferroelectric dipole MOSFeFETs 354 each have the channel region 384, which is also formed by the through-layer silicon bar 362, between the drain electrode 380 and the source electrode 382. The additional ferroelectric dipole MOSFeFETs 354 each have the ferroelectric layer 386 that is formed by the ferroelectric annulus 370 of the hollow cylinder sidewall 360 between the gate electrode 378 and the channel region 384.

The channel region 384 of the ferroelectric dipole MOSFeFET 342 and the additional ferroelectric dipole MOSFeFETs 354 have a channel region depth 388 that equals approximately the diameter D of the through-layer silicon bar 362. In this regard, when the ferroelectric dipole MOSFeFET 342 and the additional ferroelectric dipole MOSFeFETs 354 are programmed, a programming voltage applied to the gate electrode 378 needs to be high enough to control the channel region 384 up to the channel region depth 388, which may lead to a higher power of the 3D ferroelectric dipole MOSFeFET system 320. As such, it may be desired to program the ferroelectric dipole MOSFeFET 342 and the additional ferroelectric dipole MOSFeFETs 354 by applying a reduced voltage at the gate electrode 378, thus helping to improve channel region control and reduce leakage.

Figure 5:
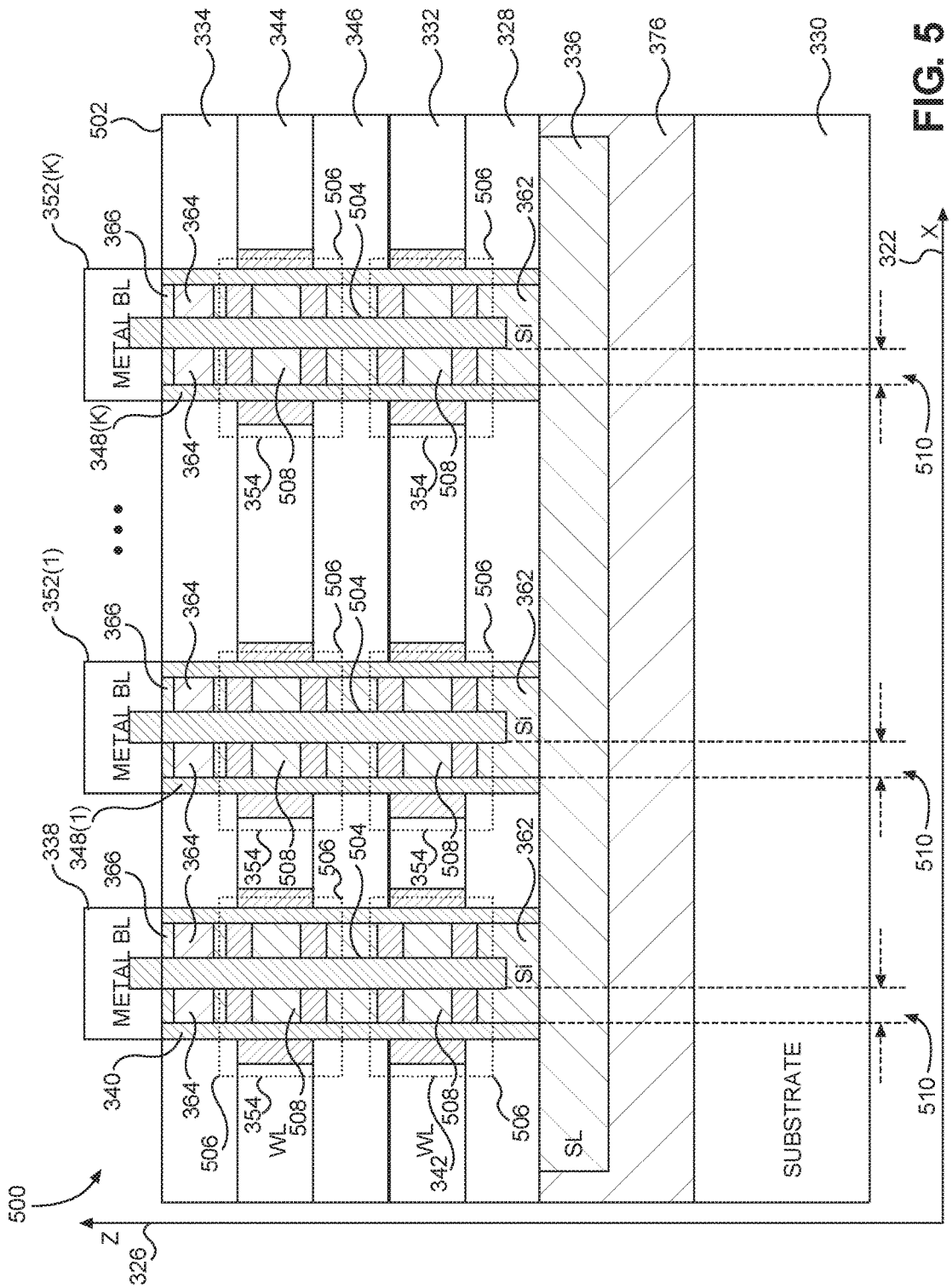
FIG. 5 is a schematic diagram of an exemplary side view of a 3D ferroelectric dipole MOSFeFET system configured to provide improved channel region control and reduced leakage when the 3D ferroelectric dipole MOSFeFET system is programmed.

In this regard, FIG. 5 is a schematic diagram of an exemplary side view 500 of a 3D ferroelectric dipole MOSFeFET system 502 configured to provide improved channel region control and reduced leakage when the 3D ferroelectric dipole MOSFeFET system 502 is programmed. Common elements between FIGS. 3C and 5 are shown therein with common element numbers and will not be re-described herein.

With reference to FIG. 5, the through-layer silicon bar 362 in the interconnect 340 and the additional interconnects 348(1)-348(K) includes a circular cylindrical-shaped via 504 extending vertically from the silicide layer 366 through the gate layer 332. As shown in FIG. 5, the circular cylindrical-shaped via 504 extends beyond the gate layer 332 and into the bottom dielectric layer 328. In a non-limiting example, the circular cylindrical-shaped via 504 is coated with dielectric film or filled with dielectric material.

The circular cylindrical-shaped via 504 causes one or more ferroelectric dipole MOSFeFETs 506 in the 3D ferroelectric dipole MOSFeFET system 502 to have a channel region 508 of a reduced channel region depth 510. As a result, it may be possible to program the ferroelectric dipole MOSFeFETs 506 with a reduced programming voltage, thus helping to improve channel region control and reduce leakage in the 3D ferroelectric dipole MOSFeFET system 502.

The 3D ferroelectric dipole MOSFeFET system 320 of FIGS. 3B-3D and the 3D ferroelectric dipole MOSFeFET system 502 of FIG. 5 can be provided in a memory system, such as a 3D ferroelectric random access memory (3D FeRAM). In this regard, FIG. 6 is a schematic diagram of an exemplary memory system 600, which may be a 3D FeRAM system, including a memory array 602 that can be provided based on the 3D ferroelectric dipole MOSFeFET system 320 of FIGS. 3B-3D and/or the 3D ferroelectric dipole MOSFeFET system 502 of FIG. 5.

Figure 6:
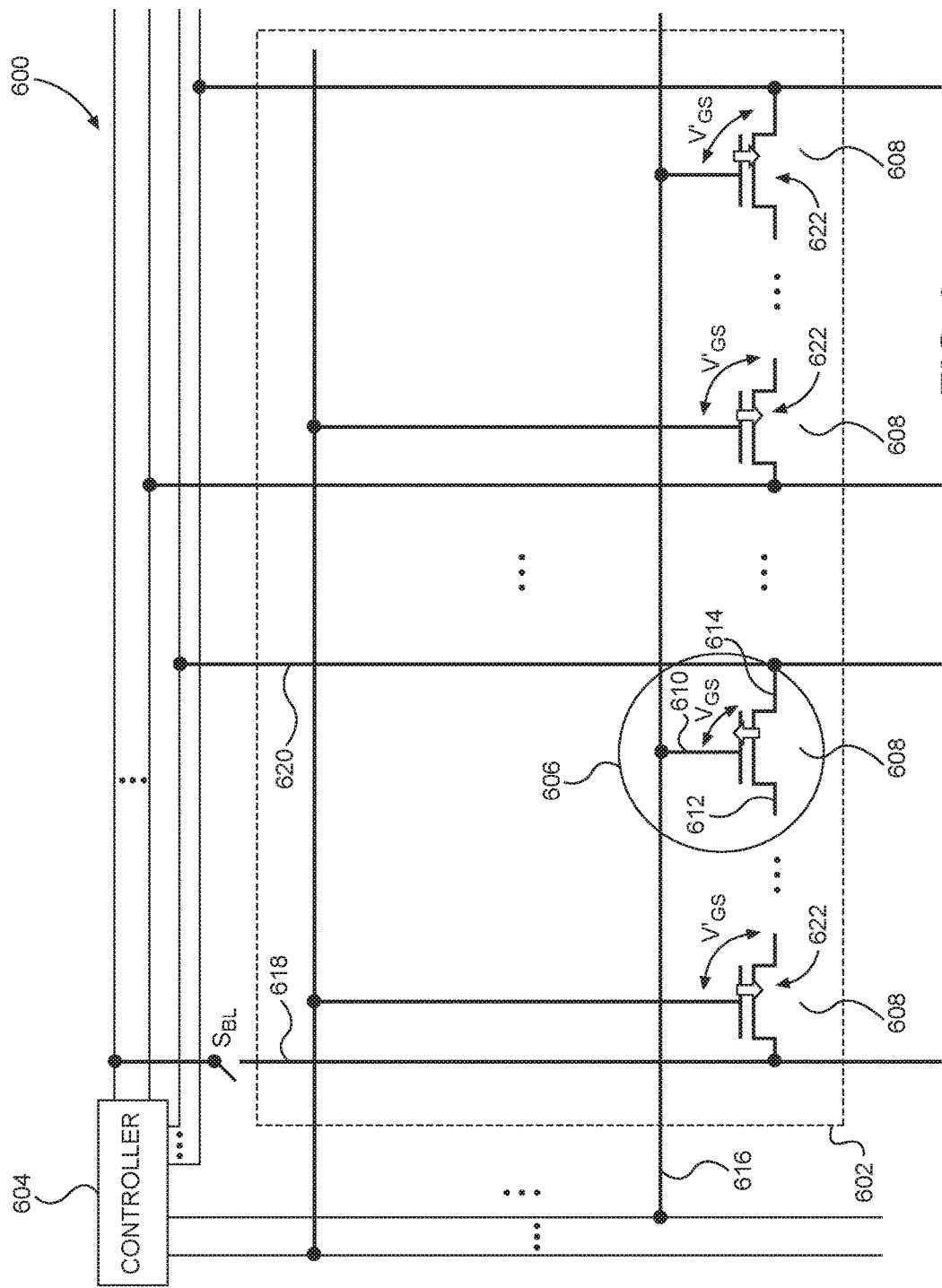
FIG. 6 is a schematic diagram of an exemplary memory system including a memory array, which may be a 3D ferroelectric random access memory (3D FeRAM) system, that can be provided based on the 3D ferroelectric dipole MOSFeFET system of FIGS. 3B-3D and/or the 3D ferroelectric dipole MOSFeFET system of FIG. 5.

With reference to FIG. 6, the memory system (3D FeRAM) 600 includes a controller 604, which may be a microprocessor or a microcontroller. In a non-limiting example, the controller 604 is configured to program or erase a selected ferroelectric dipole MOSFeFET 606 (e.g., the ferroelectric dipole MOSFeFET 342 of FIGS. 3B-3D) among a plurality of ferroelectric dipole MOSFeFETs 608 using an electric field to avoid a charge trap from being generated in the selected ferroelectric dipole MOSFeFET 606. The selected ferroelectric dipole MOSFeFET 606 has a gate electrode 610, a drain electrode 612, and a source electrode 614 that are coupled to a respective WL 616, a respective BL 618, and a respective SL 620 to form a negative-AND (NAND) 3D FeRAM.

As discussed below, the controller 604 is configured to generate the electric field by applying a programming or an erasing voltage between the gate electrode 610 and the source electrode 614 of the selected ferroelectric dipole MOSFeFET 606, while keeping the drain electrode 612 or the source electrode 614 floating, or applying an equal voltage between the BL 618, which is coupled to the drain electrode 612, and the SL 620, which is coupled to the source electrode 614. In a non-limiting example, the controller 604 can keep the drain electrode 612 floating by opening a switch $S_{BL}$ coupled to the respective BL 618. By programming or erasing the selected ferroelectric dipole MOSFeFET 606 using the electric field, it may be possible to avoid generating a switching electrical current (e.g., the switching electrical current 132 of FIG. 2A) in a channel region (e.g., the channel region 126 of FIG. 2A) to prevent a charge trap (e.g., the charge trap 200 of FIG. 2A) in the selected ferroelectric dipole MOSFeFET 606. As a result, it may be possible to provide more reliable information access in the selected ferroelectric dipole MOSFeFET 606.

In one non-limiting example, the selected ferroelectric dipole MOSFeFET 606 is an n-type ferroelectric dipole MOSFeFET 606. In this regard, the controller 604 is configured to program the selected n-type ferroelectric dipole MOSFeFET 606 by applying a switching voltage $V_{GS}$ greater than or equal to a positive program voltage $V_{PG}$ between the gate electrode 610 and the source electrode 614. The controller 604 is configured to erase the n-type ferroelectric dipole MOSFeFET 606 by applying the switching voltage $V_{GS}$ less than a negative erase voltage $-V_{ER}$ between the gate electrode 610 and the source electrode 614. To prevent the charge trap from being generated in the n-type ferroelectric dipole MOSFeFET 606, the controller 604 keeps the drain electrode 612 or the source electrode 614 floating, or applies an equal voltage to the drain electrode 612 and the source electrode 614 by applying the equal voltage to the BL 618 and the SL 620. Table 1 below provides an exemplary configuration of the gate electrode 610, the drain electrode 612, and the source electrode 614 for programming and erasing the n-type ferroelectric dipole MOSFeFET 606.

TABLE 1

| Operation | Voltage at the gate electrode (610) | Voltage at the source electrode (614) | Voltage at the drain electrode (612) |
|---|---|---|---|
| Programming | $V_{PG}$ | 0 V | Floating or 0 V |
|  | ½ $V_{PG}$ | −½ $V_{PG}$ | Floating or −½ $V_{PG}$ |
| Erasing | $-V_{ER}$ | 0 V | Floating or 0 V |
|  | −½ $V_{ER}$ | ½ $V_{ER}$ | Floating or ½ $V_{ER}$ |

In another non-limiting example, the selected ferroelectric dipole MOSFeFET 606 is a p-type ferroelectric dipole MOSFeFET 606. In this regard, the controller 604 is configured to program the selected p-type ferroelectric dipole MOSFeFET 606 by applying the switching voltage $V_{GS}$ less than a negative program voltage $-V_{PG}$ between the gate electrode 610 and the source electrode 614. The controller 604 is configured to erase the p-type ferroelectric dipole MOSFeFET 606 by applying the switching voltage $V_{GS}$ greater than or equal to a positive erase voltage $V_{ER}$ between gate electrode 610 and the source electrode 614. To prevent the charge trap from being generated in the p-type ferroelectric dipole MOSFeFET 606, the controller 604 keeps the drain electrode 612 floating, or applies an equal voltage to the drain electrode 612 and the source electrode 614. Table 2 below provides an exemplary configuration of the gate electrode 610, the drain electrode 612, and the source electrode 614 for programming and erasing the p-type ferroelectric dipole MOSFeFET 606.

TABLE 2

| Operation | Voltage at the gate electrode (610) | Voltage at the source electrode (614) | Voltage at the drain electrode (612) |
|---|---|---|---|
| Programming | $-V_{PG}$ | 0 V | Floating or 0 V |
|  | −½ $V_{PG}$ | ½ $V_{PG}$ | Floating or ½ $V_{PG}$ |
| Erasing | $V_{ER}$ | 0 V | Floating or 0 V |
|  | ½ $V_{ER}$ | −½ $V_{ER}$ | Floating or −½ $V_{ER}$ |

In addition to programming or erasing the selected ferroelectric dipole MOSFeFET 606 without generating the charge trap, the controller 604 is further configured to prevent the non-programmed ferroelectric dipole MOSFeFETs 622, which includes the rest of the ferroelectric dipole MOSFeFETs 608 except for the selected ferroelectric dipole MOSFeFET 606, from being accidentally programmed or erased. In this regard, the controller 604 is configured to apply a gate-source voltage $V'_{GS}$ to the non-programmed ferroelectric dipole MOSFeFETs 622 and maintains the gate-source voltage $V'_{GS}$ at a proper level. In a non-limiting example, the gate-source voltage $V'_{GS}$ can be one-half (½) of the positive program voltage $V_{PG}$ and the positive erase voltage $V_{ER}$.

In one non-limiting example, the controller 604 maintains the gate-source voltage $V'_{GS}$ to be lower than the positive program voltage $V_{PG}$ when programming the n-type ferroelectric dipole MOSFeFET 606 or higher than the negative erase voltage $-V_{ER}$ when erasing the n-type ferroelectric dipole MOSFeFET 606. In another non-limiting example, the controller 604 maintains the gate-source voltage $V'_{GS}$ to be higher than the negative program voltage $-V_{PG}$ when programming the p-type ferroelectric dipole MOSFeFET 606 or lower than the positive erase voltage $V_{ER}$ when erasing the p-type ferroelectric dipole MOSFeFET 606. As such, the controller 604 can prevent the non-programmed ferroelectric dipole MOSFeFETs 622 from being accidentally programmed or erased.

The controller 604 is configured to read the selected ferroelectric dipole MOSFeFET 606 by applying a read voltage on either the drain electrode 612 or the source electrode 614. Because the selected ferroelectric dipole MOSFeFET 606 is programmed by the electric field, it may be possible to avoid the charge trap (e.g., the charge trap 200 of FIG. 2A) from generating in the selected ferroelectric dipole MOSFeFET 606. As a result, the selected ferroelectric dipole MOSFeFET 606 can be read from the drain electrode 612 and the source electrode 614 with the same result. To validate that the charge trap can be effectively prevented when the selected ferroelectric dipole MOSFeFET 606 is programmed or erased based on the electric field, FIGS. 7A-7F are provided and discussed next.

Figure 7A:
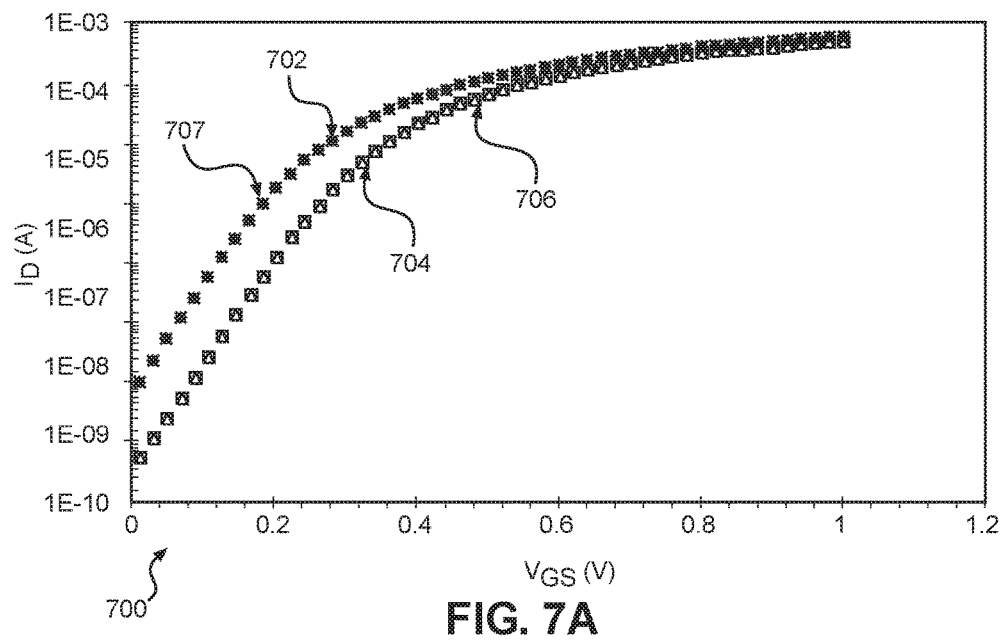
FIG. 7A is a plot of an exemplary drain-side-read and source-side-read $I_D$-$V_{GS}$ curve that graphically validates charge trap prevention configuration for the memory array of FIG. 6 when a selected ferroelectric dipole MOSFeFET is programmed.

In this regard, FIG. 7A is a plot of an exemplary drain-side-read and source-side-read $I_D$-$V_{GS}$ curve 700 that graphically validates the charge trap prevention configuration for the memory array 602 of FIG. 6 when the selected ferroelectric dipole MOSFeFET 606 is programmed.

The drain-side-read and source-side-read $I_D$-$V_{GS}$ curve 700 includes a pre-programming drain-side-read $I_D$-$V_{GS}$ curve 702, a post-programming drain-side-read $I_D$-$V_{GS}$ curve 704, a post-programming source-side-read $I_D$-$V_{GS}$ curve 706, and a post-erasing drain-side-read $I_D$-$V_{GS}$ curve 707. When the switching voltage $V_{GS}$ greater than the positive program voltage $V_{PG}$ is applied to the selected ferroelectric dipole MOSFeFET 606, the pre-programming drain-side-read $I_D$-$V_{GS}$ curve 702 shifts toward the post-programming drain-side-read $I_D$-$V_{GS}$ curve 704. As discussed earlier with reference to Eq. 1, the reading rightward shift of the pre-programming drain-side-read $I_D$-$V_{GS}$ curve 702 is due to changes of the flat-band voltage ($V_{fb}$). To generate the post-programming source-side-read $I_D$-$V_{GS}$ curve 706, a reading voltage is applied between the gate electrode 610 and the drain electrode 612 of the selected ferroelectric dipole MOSFeFET 606. Understandably from previous discussions, the post-programming source-side-read $I_D$-$V_{GS}$ curve 706 would not be properly aligned with the post-programming drain-side-read $I_D$-$V_{GS}$ curve 704 if the charge trap had existed in the selected ferroelectric dipole MOSFeFET 606. When the switching voltage $V_{GS}$ lower than the negative erase voltage -$V_{ER}$ is applied to the selected ferroelectric dipole MOSFeFET 606, the post-erasing drain-side-read $I_D$-$V_{GS}$ curve 707 shifts back the pre-programming drain-side-read $I_D$-$V_{GS}$ curve 702. Hence, by illustrating a substantial alignment between the post-programming drain-side-read $I_D$-$V_{GS}$ curve 704 and the post-programming source-side-read $I_D$-$V_{GS}$ curve 706, as well as a substantial alignment between the post-erasing drain-side-read $I_D$-$V_{GS}$ curve 707 and the pre-programming drain-side-read $I_D$-$V_{GS}$ curve 702, the drain-side-read and source-side-read $I_D$-$V_{GS}$ curve 700 proves that the charge trap prevention configuration described in FIG. 6 is effective.

Figure 7B:
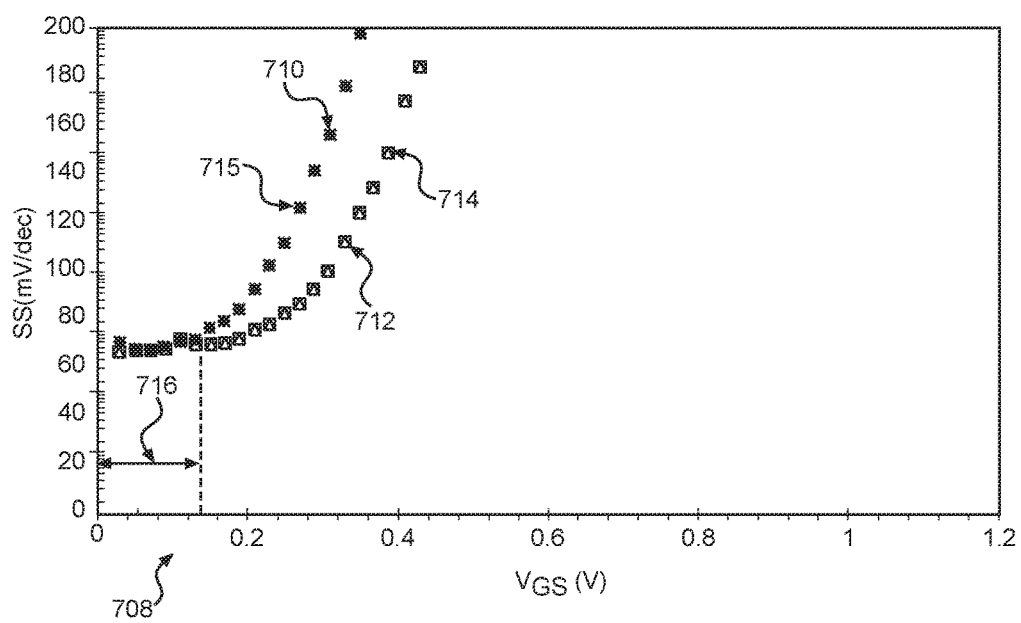
FIG. 7B is a plot of an exemplary sub-threshold slop (SS) reading curve that graphically validates charge trap prevention configuration for the memory array of FIG. 6 when a selected ferroelectric dipole MOSFeFET is programmed.

FIG. 7B is a plot of an exemplary sub-threshold slop (SS) reading curve 708 that graphically validates the charge trap prevention configuration for the memory array 602 of FIG. 6 when the selected ferroelectric dipole MOSFeFET 606 is programmed. The SS reading curve 708 illustrates a pre-programming SS drain-side-read curve 710, a post-programming drain-side-read SS curve 712, a post-programming source-side-read SS curve 714, and a post-erasing drain-side-read SS curve 715 that correspond to the pre-programming drain-side-read $I_D$-$V_{GS}$ curve 702, the post-programming drain-side-read $I_D$-$V_{GS}$ curve 704, the post-programming source-side-read $I_D$-$V_{GS}$ curve 706, and the post-erasing drain-side-read $I_D$-$V_{GS}$ curve 707 of FIG. 7A, respectively. As illustrated in the SS reading curve 708, the pre-programming SS drain-side-read curve 710, the post-programming drain-side-read SS curve 712, the post-programming source-side-read SS curve 714, and the post-erasing drain-side-read SS curve 715 are in substantial agreement in a sub-threshold region 716. By showing good agreement in the sub-threshold region 716 between the SS reading curve 708, the pre-programming SS drain-side-read curve 710, the post-programming drain-side-read SS curve 712, the post-programming source-side-read SS curve 714, and the post-erasing drain-side-read SS curve 715, the SS reading curve 708 also proves that the charge trap prevention configuration described in FIG. 6 is effective.

Figure 7C:
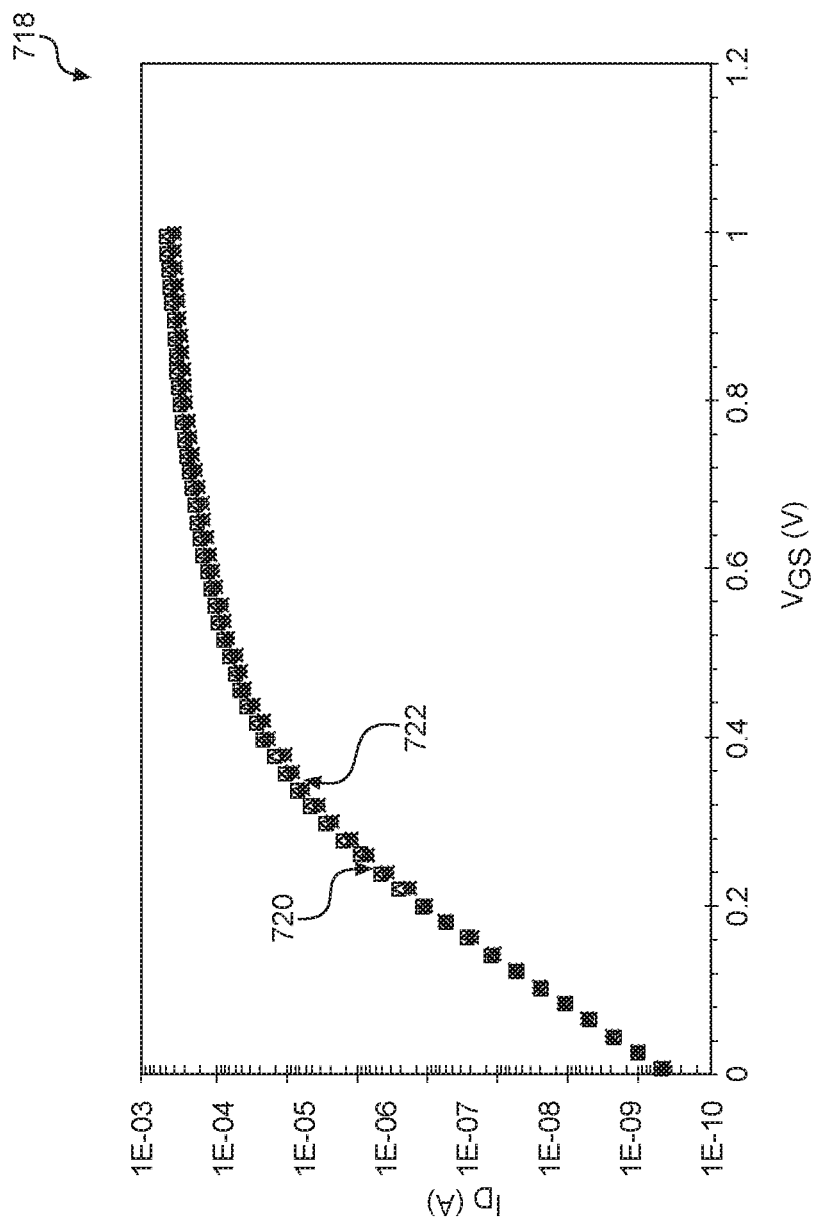
FIG. 7C is a plot of an exemplary drain-side-read and source-side-read $I_D$-$V_{GS}$ curve that graphically validates charge trap prevention configuration for the memory array of FIG. 6 when a selected ferroelectric dipole MOSFeFET is programmed.

FIG. 7C is a plot of an exemplary drain-side-read and source-side-read $I_D$-$V_{GS}$ curve 718 that graphically validates the charge trap prevention configuration for the memory array 602 of FIG. 6 when the selected ferroelectric dipole MOSFeFET 606 is programmed. The drain-side-read and source-side-read $I_D$-$V_{GS}$ curve 718 includes a drain-side-read $I_D$-$V_{GS}$ curve 720 and a source-side-read $I_D$-$V_{GS}$ curve 722. According to earlier discussions with reference to FIG. 2B, the drain-side-read $I_D$-$V_{GS}$ curve 720 and the source-side-read $I_D$-$V_{GS}$ curve 722 would not be in substantial agreement if the charge trap had existed in the selected ferroelectric dipole MOSFeFET 606. Hence, by illustrating a substantial agreement between the drain-side-read $I_D$-$V_{GS}$ curve 720 and the source-side-read $I_D$-$V_{GS}$ curve 722, the drain-side-read and source-side-read $I_D$-$V_{GS}$ curve 718 further proves that the charge trap prevention configuration described in FIG. 6 is effective.

Figure 7D:
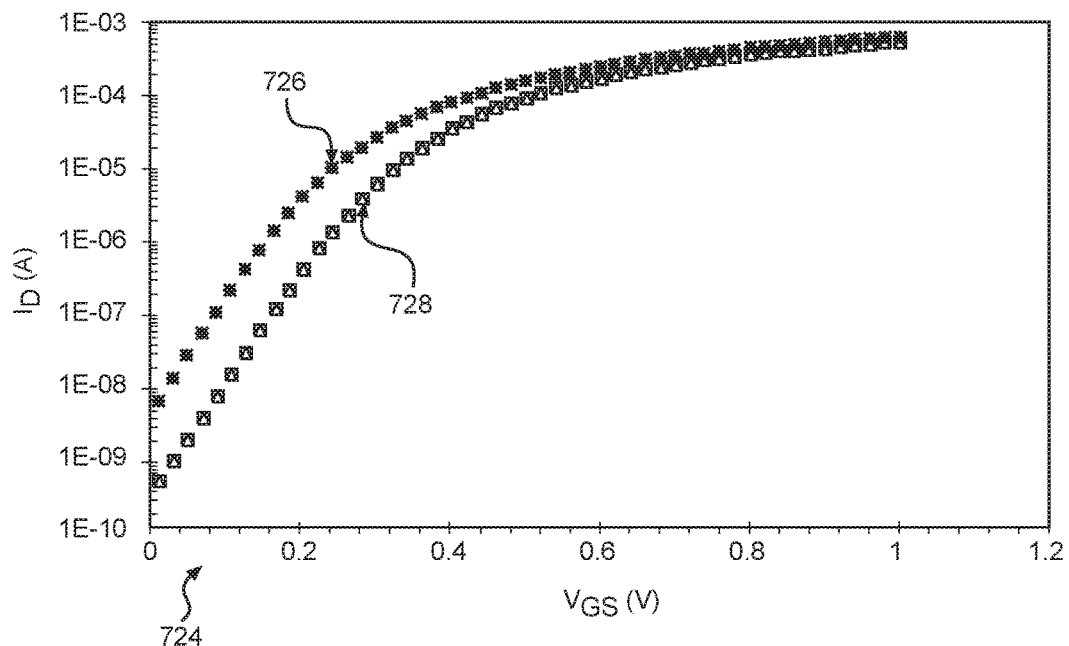
FIG. 7D is a plot of an exemplary pre-programming post-erasing $I_D$-$V_{GS}$ curve that graphically validates charge trap prevention configuration for the memory array of FIG. 6 when a selected ferroelectric dipole MOSFeFET is erased.

As previously discussed in the $I_D$-$V_{GS}$ curve 204 in FIG. 2B above, when the nMOSFeFET 100 of FIG. 2A is erased, the post-programming curve 208 only returns to the post-erasing curve 210 as opposed to returning all the way to the pre-programming curve 206 due to existence of the charge trap 200. In this regard, FIG. 7D is a plot of an exemplary pre-programming post-erasing $I_D$-$V_{GS}$ curve 724 that graphically validates the charge trap prevention configuration for the memory array 602 of FIG. 6 when the selected ferroelectric dipole MOSFeFET 606 is erased. The pre-programming post-erasing $I_D$-$V_{GS}$ curve 724 includes a pre-programming curve 726 and a post-erasing curve 728. In contrast to the post-erasing curve 210 in FIG. 2B, which does not return all the way back to the pre-programming curve 206 due to the existence of the charge trap 200, the post-erasing curve 728 is in substantial alignment with the pre-programming curve 726 after the selected ferroelectric dipole MOSFeFET 606 is erased. This further proves that the charge trap prevention configuration described in FIG. 6 is effective.

Figure 7E:
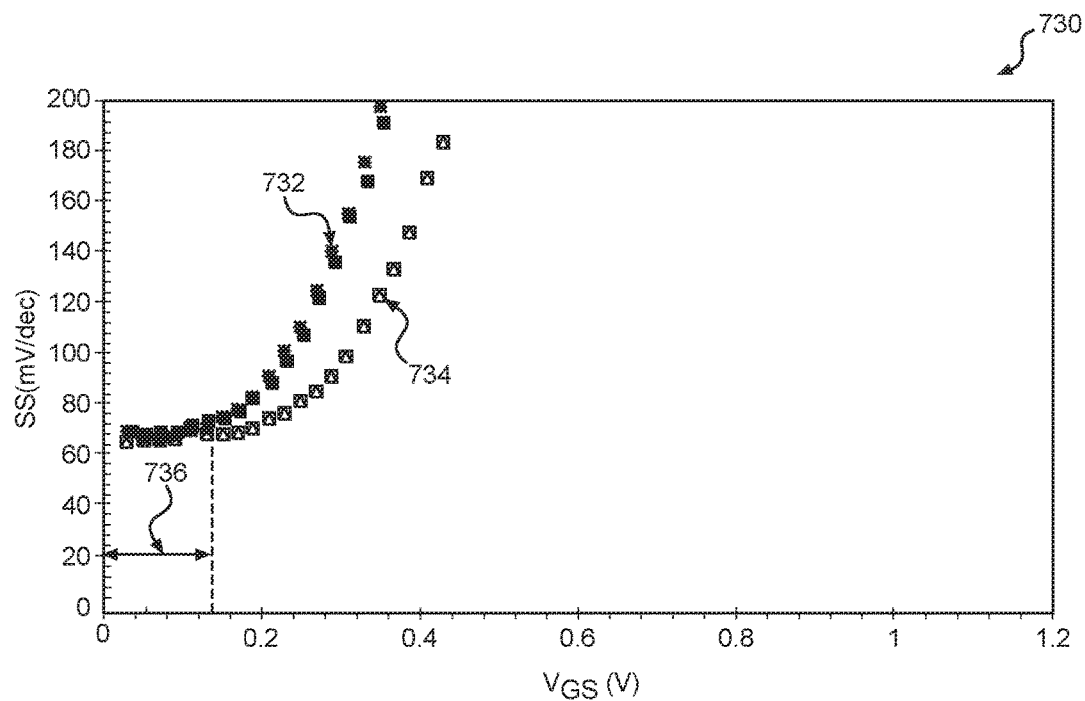
FIG. 7E is a plot of an exemplary SS reading curve that graphically validates charge trap prevention configuration for the memory array of FIG. 6 when a selected ferroelectric dipole MOSFeFET is erased.

FIG. 7E is a plot of an exemplary SS reading curve 730 that graphically validates the charge trap prevention configuration for the memory array 602 of FIG. 6 when the selected ferroelectric dipole MOSFeFET 606 is erased. The SS reading curve 730 includes a pre-programming SS and post-erasing curve 732 and a post-programming and pre-erasing curve 734. The pre-programming SS and post-erasing curve 732 and the post-programming and pre-erasing curve 734 show substantial agreement in a pre-threshold region 736, further proving that the charge trap prevention configuration described in FIG. 6 is effective.

Figure 7F:
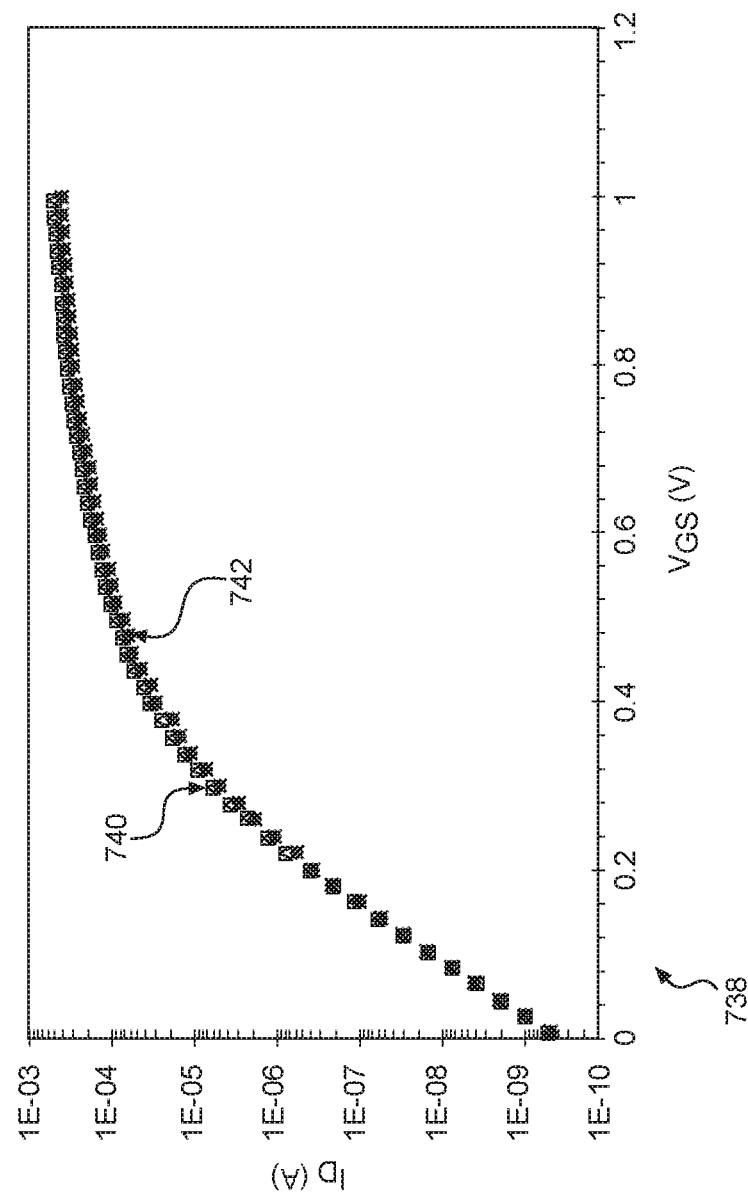
FIG. 7F is a plot of an exemplary drain-side-read and source-side-read $I_D$-$V_{GS}$ curve that graphically validates charge trap prevention configuration for the memory array of FIG. 6 when a selected ferroelectric dipole MOSFeFET is erased.

FIG. 7F is a plot of an exemplary drain-side-read and source-side-read $I_D$-$V_{GS}$ curve 738 that graphically validates the charge trap prevention configuration for the memory array 602 of FIG. 6 when the selected ferroelectric dipole MOSFeFET 606 is erased. The drain-side-read and source-side-read $I_D$-$V_{GS}$ curve 738 includes a post-erasing drain-side-read $I_D$-$V_{GS}$ curve 740 and a post-erasing source-side-read $I_D$-$V_{GS}$ curve 742. In contrast to the drain-side-read $I_D$-$V_{GS}$ curve 226 and the source-side-read $I_D$-$V_{GS}$ curve 228 of FIG. 2C that are in disagreement, the post-erasing drain-side-read $I_D$-$V_{GS}$ curve 740 and the post-erasing source-side-read $I_D$-$V_{GS}$ curve 742 are in substantial agreement with each other. Therefore, the charge trap prevention configuration described in FIG. 6 is proven to be effective.

The 3D ferroelectric dipole MOSFeFET system 320 of FIGS. 3B-3D, the 3D ferroelectric dipole MOSFeFET system 502 of FIG. 5, and the memory array 602 of FIG. 6 may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
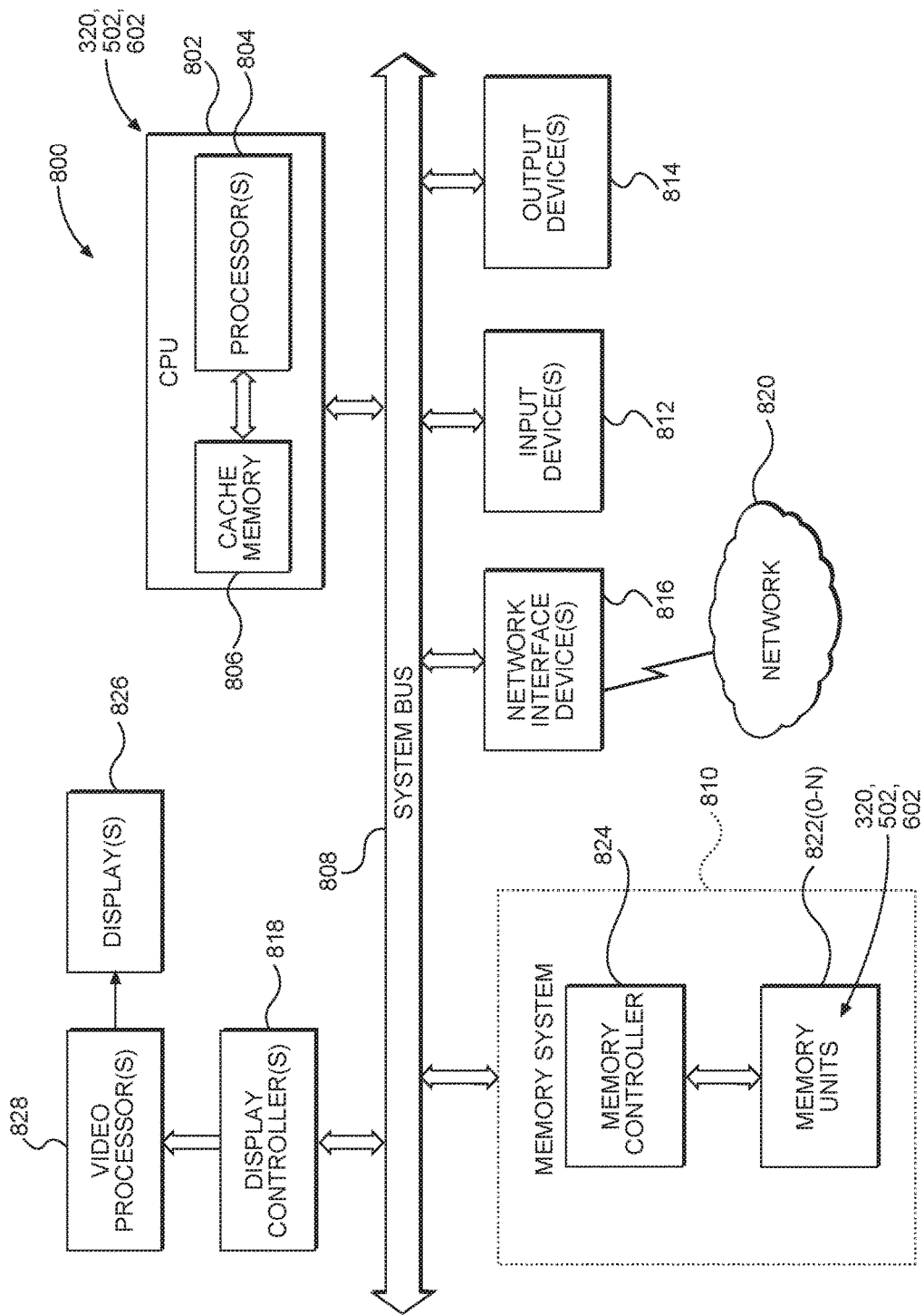
FIG. 8 illustrates an exemplary processor-based system that can include the 3D ferroelectric dipole MOSFeFET system of FIGS. 3B-3D, the 3D ferroelectric dipole MOSFeFET system of FIG. 5, and the memory array of FIG. 6.

In this regard, FIG. 8 illustrates an exemplary processor-based system 800 that can include the 3D ferroelectric dipole MOSFeFET system 320 of FIGS. 3B-3D, the 3D ferroelectric dipole MOSFeFET system 502 of FIG. 5, and the memory array 602 of FIG. 6. In this example, the processor-based system 800 includes one or more central processing units (CPUs) 802, each including one or more processors 804. In this regard, the 3D ferroelectric dipole MOSFeFET system 320 of FIGS. 3B-3D, the 3D ferroelectric dipole MOSFeFET system 502 of FIG. 5, and the memory array 602 of FIG. 6 may be provided in the CPU(s) 802 to store binary information (e.g., state information, encryption key, etc.). The CPU(s) 802 may have cache memory 806 coupled to the processor(s) 804 for rapid access to temporarily stored data. In this regard, the 3D ferroelectric dipole MOSFeFET system 320 of FIGS. 3B-3D, the 3D ferroelectric dipole MOSFeFET system 502 of FIG. 5, and the memory array 602 of FIG. 6 may be provided as part of the cache memory 806. The CPU(s) 802 is coupled to a system bus 808. As is well known, the CPU(s) 802 communicates with other devices by exchanging address, control, and data information over the system bus 808. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 810, one or more input devices 812, one or more output devices 814, one or more network interface devices 816, and one or more display controllers 818, as examples. The input device(s) 812 can include any type of input device, including, but not limited to, input keys, switches, voice processors, etc. The output device(s) 814 can include any type of output device, including, but not limited to, audio, video, other visual indicators, etc. The network interface device(s) 816 can be any device configured to allow exchange of data to and from a network 820. The network 820 can be any type of network, including, but not limited to, a wired or wireless network, a private or public network, a local area network (LAN), a wireless local area network (WLAN), a wide area network (WAN), a BLUETOOTH™ network, or the Internet. The network interface device(s) 816 can be configured to support any type of communications protocol desired. The memory system 810 can include one or more memory units 822(0-N) and a memory controller 824. In this regard, the 3D ferroelectric dipole MOSFeFET system 320 of FIGS. 3B-3D, the 3D ferroelectric dipole MOSFeFET system 502 of FIG. 5, and the memory array 602 of FIG. 6 may be provided as part of the memory units 822(0-N).

The CPU(s) 802 may also be configured to access the display controller(s) 818 over the system bus 808 to control information sent to one or more displays 826. The display controller(s) 818 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory system, comprising:
a three-dimensional (3D) ferroelectric dipole metal-oxide semiconductor ferroelectric field-effect transistor (MOSFeFET) system, comprising:
 a bottom dielectric layer disposed above a substrate;
 at least one source line;
 a gate layer disposed above the bottom dielectric layer;
 a top dielectric layer disposed above the gate layer;
 at least one bit line disposed such that the bottom dielectric layer, the gate layer, and the top dielectric layer are between the at least one source line and the at least one bit line;
 at least one interconnect extending between the bottom dielectric layer and the top dielectric layer electrically interconnecting the at least one source line with the at least one bit line; and
 at least one ferroelectric dipole MOSFeFET formed at an intersection area of the at least one interconnect and the gate layer.

2. The memory system of claim 1, wherein the at least one bit line is disposed below the bottom dielectric layer and the at least one source line is disposed above the top dielectric layer perpendicular to the at least one bit line.

3. The memory system of claim 1, wherein the at least one source line is disposed below the bottom dielectric layer and the at least one bit line is disposed above the top dielectric layer perpendicular to the at least one source line.

4. The memory system of claim 1, wherein the 3D ferroelectric dipole MOSFeFET system further comprises:
 at least one additional dielectric layer disposed above the gate layer;
 at least one additional gate layer disposed between the at least one additional dielectric layer and the top dielectric layer;
 one or more additional source lines disposed in parallel to the at least one source line;
 one or more additional bit lines disposed in parallel to the at least one bit line;
 one or more additional interconnects each extending vertically from the bottom dielectric layer to the top dielectric layer electrically interconnecting a respective source line among the one or more additional source lines with a respective bit line among the one or more additional bit lines; and
 one or more additional ferroelectric dipole MOSFeFETs formed at one or more intersection areas between the at least one interconnect and the at least one additional gate layer, between the one or more additional interconnects and the gate layer, and between the one or more additional interconnects and the at least one additional gate layer.

5. The memory system of claim 1, wherein the at least one interconnect comprises at least one cylindrical-shaped through-layer silicon bar, comprising:
 a hollow cylinder sidewall having a ferroelectric annulus bounded by an inner circular cylinder corresponding to an inner radius and an outer circular cylinder corresponding to an outer radius larger than the inner radius;
 a through-layer silicon bar filling the inner circular cylinder of the hollow cylinder sidewall and coupled to the at least one source line;
 a silicon bar-top disposed above the through-layer silicon bar; and
 a silicide layer disposed between the silicon bar-top and the at least one bit line.

6. The memory system of claim 5, wherein the ferroelectric annulus of the hollow cylinder sidewall is formed by a ferroelectric material selected from the group consisting of Hafnium oxide doped with Aluminum (HfAlOx); Hafnium oxide doped with Zirconium (HfZrOx); and Hafnium oxide doped with Silicon (HfSiOx).

7. The memory system of claim 5, wherein the at least one ferroelectric dipole MOSFeFET comprises:
 a gate electrode formed by the gate layer;
 a drain electrode formed by the through-layer silicon bar and coupled to the at least one bit line;
 a source electrode formed by the through-layer silicon bar and coupled to the at least one source line;
 a channel region formed by the through-layer silicon bar between the drain electrode and the source electrode; and
 a ferroelectric layer formed by the ferroelectric annulus of the hollow cylinder sidewall between the gate electrode and the channel region.

8. The memory system of claim 7, further comprising a controller configured to program or erase the at least one ferroelectric dipole MOSFeFET based on an electric field.

9. The memory system of claim 8, wherein:
the at least one ferroelectric dipole MOSFeFET is at least one n-type ferroelectric dipole MOSFeFET; and
the controller is configured to:
 program the at least one n-type ferroelectric dipole MOSFeFET by applying a switching voltage greater than or equal to a positive program voltage between the gate electrode and the source electrode; and
 erase the at least one n-type ferroelectric dipole MOSFeFET by applying the switching voltage less than a negative erase voltage between the gate electrode and the source electrode.

10. The memory system of claim 9, wherein the controller is further configured to keep the drain electrode or the source electrode floating.

11. The memory system of claim 9, wherein the controller is further configured to apply an equal voltage to the source electrode and the drain electrode.

12. The memory system of claim 8, wherein:
the at least one ferroelectric dipole MOSFeFET is at least one p-type ferroelectric dipole MOSFeFET; and
the controller is configured to:
 program the at least one p-type ferroelectric dipole MOSFeFET by applying a switching voltage less than a negative program voltage between the gate electrode and the source electrode; and
 erase the at least one p-type ferroelectric dipole MOSFeFET by applying the switching voltage greater than or equal to a positive erase voltage between the gate electrode and the source electrode.

13. The memory system of claim 12, wherein the controller is further configured to keep the drain electrode or the source electrode floating.

14. The memory system of claim 12, wherein the controller is further configured to apply an equal voltage to the source electrode and the drain electrode.

15. The memory system of claim 5, further comprising the substrate and an isolation layer disposed between the bottom dielectric layer and the substrate.

16. The memory system of claim 5, wherein:
the through-layer silicon bar comprises a circular cylindrical-shaped via extending vertically from the silicide layer through the gate layer; and
a dielectric film is disposed inside the circular cylindrical-shaped via.

17. The memory system of claim 15, wherein the 3D ferroelectric dipole MOSFeFET system is an n-type 3D ferroelectric dipole MOSFeFET system, wherein:
the through-layer silicon bar is p-minus (P−) doped;
the silicon bar-top is p-plus (P+) doped;
the at least one source line is p-plus (P+) doped; and
the gate layer is provided as a p-plus (P+) poly layer, a p-type metal gate layer, n-plus (N+) poly layer, or n-type metal gate layer.

18. The memory system of claim 17, wherein:
the substrate is provided as a p-minus (P−) substrate; and
the isolation layer is provided as an n-minus (N−) well.

19. The memory system of claim 17, wherein:
the substrate is provided as a p-minus (P−) substrate; and
the isolation layer is provided as an oxide layer.

20. The memory system of claim 15, wherein the 3D ferroelectric dipole MOSFeFET system is a p-type 3D ferroelectric dipole MOSFeFET system, wherein:
the through-layer silicon bar is n-minus (N−) doped;
the silicon bar-top is n-plus (N+) doped;
the at least one source line is n-plus (N+) doped; and
the gate layer is provided as an n-plus (N+) poly layer, an n-type metal gate layer, p-plus (P+) poly layer, or an p-type metal gate layer.

21. The memory system of claim 20, wherein:
the substrate is provided as a p-minus (P−) substrate; and
the isolation layer is provided as a p-minus (P−) well.

22. The memory system of claim 20, wherein:
the substrate is provided as a p-minus (P−) substrate; and
the isolation layer is provided as an oxide layer.

23. A memory system, comprising:
a means for forming a high-density ferroelectric dipole metal-oxide semiconductor ferroelectric field-effect transistor (MOSFeFET) system, comprising:
a bottom dielectric layer disposed above a substrate;
at least one source line;
a gate layer disposed above the bottom dielectric layer;
a top dielectric layer disposed above the gate layer;
at least one bit line disposed such that the bottom dielectric layer, the gate layer, and the top dielectric layer are between the at least one source line and the at least one bit line;
at least one interconnect extending between the bottom dielectric layer and the top dielectric layer electrically interconnecting the at least one source line with the at least one bit line; and
at least one ferroelectric dipole MOSFeFET formed at an intersection area of the at least one interconnect and the gate layer.

24. A method for fabricating a three-dimensional (3D) ferroelectric dipole metal-oxide semiconductor ferroelectric field-effect transistor (MOSFeFET) system, comprising:
providing a bottom dielectric layer above a substrate;
disposing at least one source line;
disposing a gate layer above the bottom dielectric layer;
disposing a top dielectric layer above the gate layer;
disposing at least one bit line such that the bottom dielectric layer, the gate layer, and the top dielectric layer are between the at least one source line and the at least one bit line;
disposing at least one interconnect extending between the bottom dielectric layer and the top dielectric layer electrically interconnecting the at least one source line with the at least one bit line; and
forming at least one ferroelectric dipole MOSFeFET at an intersection area of the at least one interconnect and the gate layer.

25. The method of claim 24, further comprising disposing the at least one bit line below the bottom dielectric layer and disposing the at least one source line above the top dielectric layer perpendicular to the at least one bit line.

26. The method of claim 24, further comprising disposing the at least one source line below the bottom dielectric layer and disposing the at least one bit line above the top dielectric layer perpendicular to the at least one source line.

27. The method of claim 24, further comprising:
disposing at least one additional dielectric layer above the gate layer;
disposing at least one additional gate layer between the at least one additional dielectric layer and the top dielectric layer;
disposing one or more additional source lines in parallel to the at least one source line;
disposing one or more additional bit lines in parallel to the at least one bit line;
disposing one or more additional interconnects each extending vertically from the bottom dielectric layer to the top dielectric layer electrically interconnecting a respective source line among the one or more additional source lines with a respective bit line among the one or more additional bit lines; and
forming one or more additional ferroelectric dipole MOSFeFETs at one or more intersection areas between the at least one interconnect and the at least one additional gate layer, between the one or more additional interconnects and the gate layer, and between the one or more additional interconnects and the at least one additional gate layer.

28. The method of claim 24, further comprising forming the at least one interconnect by providing at least one cylindrical-shaped through-layer silicon bar comprising:
a hollow cylinder sidewall having a ferroelectric annulus bounded by an inner circular cylinder corresponding to an inner radius and an outer circular cylinder corresponding to an outer radius larger than the inner radius;
a through-layer silicon bar filling the inner circular cylinder of the hollow cylinder sidewall and coupled to the at least one source line;
a silicon bar-top disposed above the through-layer silicon bar; and
a silicide layer disposed between the silicon bar-top and the at least one bit line.

29. The method of claim 28, further comprising:
forming a gate electrode of the at least one ferroelectric dipole MOSFeFET by the gate layer;
forming a drain electrode of the at least one ferroelectric dipole MOSFeFET by the through-layer silicon bar and coupled to the at least one bit line;
forming a source electrode of the at least one ferroelectric dipole MOSFeFET by the through-layer silicon bar and coupled to the at least one source line;

forming a channel region of the at least one ferroelectric dipole MOSFeFET by the through-layer silicon bar between the drain electrode and the source electrode; and forming a ferroelectric layer of the at least one ferroelectric dipole MOSFeFET by the ferroelectric annulus of the hollow cylinder sidewall between the gate electrode and the channel region.

30. The method of claim 28, further comprising providing an isolation layer between the bottom dielectric layer and the substrate.

* * * * *